United States Patent
Bowering et al.

(10) Patent No.: US 8,314,398 B2
(45) Date of Patent: Nov. 20, 2012

(54) EUV LIGHT SOURCE COMPONENTS AND METHODS FOR PRODUCING, USING AND REFURBISHING SAME

(75) Inventors: Norbert R. Bowering, San Diego, CA (US); Igor V. Fomenkov, San Diego, CA (US); Oleh V. Khodykin, San Diego, CA (US); Alexander N. Bykanov, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 13/091,923

(22) Filed: Apr. 21, 2011

(65) Prior Publication Data

US 2011/0192985 A1    Aug. 11, 2011

Related U.S. Application Data

(62) Division of application No. 12/004,871, filed on Dec. 20, 2007, now Pat. No. 7,960,701.

(51) Int. Cl.
    *G01J 3/10*       (2006.01)

(52) U.S. Cl. ........ 250/372; 356/445; 356/446; 356/448; 356/237.1; 356/237.2; 250/492.1; 250/492.2; 250/504 R

(58) Field of Classification Search .................. 250/372, 250/492.1, 492.2, 504 R
See application file for complete search history.

(56) References Cited

U.S. PATENT DOCUMENTS

| | | | |
|---|---|---|---|
| 5,265,143 A | 11/1993 | Early et al. | 378/84 |
| 5,356,662 A | 10/1994 | Early et al. | 427/140 |
| 5,698,113 A | 12/1997 | Baker et al. | 216/72 |
| 5,737,137 A | 4/1998 | Cohen et al. | 359/859 |
| 6,359,212 B1 | 3/2002 | Hall et al. | |
| 6,521,101 B1 * | 2/2003 | Skulina et al. | 204/192.27 |
| 6,549,551 B2 | 4/2003 | Ness et al. | 372/38.07 |
| 6,567,450 B2 | 5/2003 | Myers et al. | 372/55 |
| 6,625,191 B2 | 9/2003 | Knowles et al. | 372/55 |

(Continued)

FOREIGN PATENT DOCUMENTS

CA     2591530     12/2005

(Continued)

OTHER PUBLICATIONS

International Search Report, dated Mar. 25, 2009, from International Application No. PCT/US 08/13416, filed May 12, 2008.

(Continued)

*Primary Examiner* — David Porta
*Assistant Examiner* — Djura Malevic
(74) *Attorney, Agent, or Firm* — Cymer, Inc.

(57) ABSTRACT

A method is disclosed for in-situ monitoring of an EUV mirror to determine a degree of optical degradation. The method may comprise the steps/acts of irradiating at least a portion of the mirror with light having a wavelength outside the EUV spectrum, measuring at least a portion of the light after the light has reflected from the mirror, and using the measurement and a pre-determined relationship between mirror degradation and light reflectivity to estimate a degree of multi-layer mirror degradation. Also disclosed is a method for preparing a near-normal incidence, EUV mirror which may comprise the steps/acts of providing a metallic substrate, diamond turning a surface of the substrate, depositing at least one intermediate material overlying the surface using a physical vapor deposition technique, and depositing a multi-layer mirror coating overlying the intermediate material.

23 Claims, 9 Drawing Sheets

U.S. PATENT DOCUMENTS

| | | | |
|---|---|---|---|
| 6,634,760 B2 | 10/2003 | Folta et al. | 359/883 |
| 6,803,581 B2 * | 10/2004 | Prince et al. | 250/372 |
| 6,825,481 B2 * | 11/2004 | Miyake | 250/492.2 |
| 6,882,704 B2 * | 4/2005 | Schriever et al. | 378/119 |
| 6,998,620 B2 * | 2/2006 | Schriever | 250/372 |
| 7,068,367 B2 * | 6/2006 | Stobrawa et al. | 356/318 |
| 7,081,992 B2 | 7/2006 | Tichenor et al. | 359/359 |
| 7,084,982 B2 * | 8/2006 | Yamamoto et al. | 356/446 |
| 7,098,442 B2 * | 8/2006 | Chahal et al. | 250/225 |
| 7,098,994 B2 | 8/2006 | Moors et al. | 355/71 |
| 7,106,832 B2 * | 9/2006 | Klunder et al. | 378/156 |
| 7,122,814 B2 * | 10/2006 | Hergenhan et al. | 250/504 R |
| 7,161,163 B2 * | 1/2007 | Gaebel et al. | 250/504 R |
| 7,164,144 B2 | 1/2007 | Partlo et al. | 250/504 R |
| 7,193,228 B2 | 3/2007 | Bowering et al. | 250/504 R |
| 7,196,342 B2 | 3/2007 | Ershov et al. | 250/504 R |
| 7,217,940 B2 | 5/2007 | Partlo et al. | 250/504 R |
| 7,329,876 B2 * | 2/2008 | Schuermann et al. | 250/372 |
| 7,453,077 B2 * | 11/2008 | Bowering et al. | 250/504 R |
| 7,465,936 B2 * | 12/2008 | Amemiya | 250/374 |
| 7,622,727 B2 * | 11/2009 | Shirai et al. | 250/504 R |
| 2002/0085286 A1 * | 7/2002 | Drodofsky et al. | 359/619 |
| 2003/0058429 A1 * | 3/2003 | Schriever | 355/133 |
| 2003/0142410 A1 * | 7/2003 | Miyake | 359/619 |
| 2003/0146391 A1 | 8/2003 | Kleinschmidt et al. | 250/372 |
| 2004/0099808 A1 * | 5/2004 | Berger | 250/372 |
| 2005/0105066 A1 | 5/2005 | Adrianus Franken | 355/30 |
| 2005/0184247 A1 * | 8/2005 | Ito et al. | 250/372 |
| 2006/0028627 A1 | 2/2006 | Box | 355/30 |
| 2006/0219957 A1 | 10/2006 | Ershov et al. | 250/504 R |
| 2007/0125963 A1 * | 6/2007 | Van Herpen et al. | 250/492.2 |
| 2007/0170367 A1 * | 7/2007 | Schuermann et al. | 250/372 |
| 2007/0187627 A1 * | 8/2007 | Ershov et al. | 250/504 R |
| 2008/0043321 A1 | 2/2008 | Bowering et al. | 359/359 |

FOREIGN PATENT DOCUMENTS

| | | |
|---|---|---|
| JP | 2007134166 | 5/2007 |
| JP | 2007200671 | 8/2007 |
| TW | 569005 | 1/2004 |
| TW | M285698 | 1/2006 |
| TW | 200607987 | 3/2006 |
| TW | 200625833 | 7/2006 |
| WO | WO2005/091076 | 9/2005 |

OTHER PUBLICATIONS

Early, K., et al.; "Repair of soft-x-ray optical elements by stripping and redeposition of Mo/Si reflective coatings"; J. Vac. Scl. Technol. B 11(6), pp. 2926-2929; Nov./Dec. 1993.

Elton, N.J.; "An introduction to roughness and refractive index"; Surfoptic Ltd.; Materials Charactersation by Light Scattering and Reflectometry; pp. 1-7; 1994.

Krumrey, M., et al.; "Repair of high performance multilayer coatings"; SPIE vol. 1547 Multilayer Optics for Advanced X-Ray Applications 1991.

Mirkarimi, P., et al.,: "Recovery of multilayer-coated Zerodur and ULE optics for extreme-ultraviolet lighography by recoating, reactive-ion etching, and wet chemical processes"; Applied Optics; vol. 40, No. 1; Jan. 2001.

Korde, R., et al., "EUV Photodiodes with Directly Deposited Uranium Filter"; presented at EUVL Symposium, San Diego, Nov. 2005.

Salmassi, F., et al., "EUV Binary Phase Gratings: Fabrication and Application to Diffractive Optics"; Lawrence Berkeley National Laboratory, University of California; Paper LBNL'56785—Journal 2005.

Stover, J., "Interpreting Light Scatter Measurements"; Schmitt Measurement Systems, Inc.; Apr. 1994.

Sundaram, K., et al.,; "Wet etching studies of silicon nitride thin films deposited by electron cyclotron resonance (ECR) plasma enhanced chemical vapor deposition"; Microelectronic Engineering pp. 109-114, 70, 2003.

* cited by examiner

EUV LIGHT SOURCE COMPONENTS AND METHODS FOR PRODUCING, USING AND REFURBISHING SAME

CROSS-REFERENCE TO RELATED APPLICATIONS

This application is a divisional of U.S. patent application Ser. No. 12/004,871, filed on Dec. 20, 2007, now U.S. Pat. No. 7,960,701 entitled EUV LIGHT SOURCE COMPONENTS AND METHODS FOR PRODUCING, USING AND REFURBISHING SAME, the entire contents of which are hereby incorporated by reference herein.

The present application is related to U.S. patent application Ser. No. 11/827,803 filed on Jul. 13, 2007, now U.S. Pat. No. 7,898,947, issued on Mar. 1, 2011, entitled LASER PRODUCED PLASMA EUV LIGHT SOURCE HAVING A DROPLET STREAM PRODUCED USING A MODULATED DISTURBANCE WAVE, U.S. patent application Ser. No. 11/358,988 filed on Feb. 21, 2006, and published on Nov. 16, 2006, as US2006/0255298-A1, entitled LASER PRODUCED PLASMA EUV LIGHT SOURCE WITH PRE-PULSE, U.S. patent application Ser. No. 11/067,124 filed on Feb. 25, 2005, now U.S. Pat. No. 7,405,416, issued on Jul. 29, 2008, entitled METHOD AND APPARATUS FOR EUV PLASMA SOURCE TARGET DELIVERY, U.S. patent application Ser. No. 11/174,443 filed on Jun. 29, 2005, now U.S. Pat. No. 7,372,056, issued on May 13, 2008, entitled LPP EUV PLASMA SOURCE MATERIAL TARGET DELIVERY SYSTEM, U.S. patent application Ser. No. 11/358,983, filed on Feb. 21, 2006, now U.S. Pat. No. 7,378,673, issued on May 27, 2008, entitled SOURCE MATERIAL DISPENSER FOR EUV LIGHT SOURCE, U.S. patent application Ser. No. 11/358,992 filed on Feb. 21, 2006, now U.S. Pat. 7,598,509, issued on Oct. 6, 2009, entitled LASER PRODUCED PLASMA EUV LIGHT SOURCE, U.S. patent application Ser. No. 11/174,299 filed on Jun. 29, 2005, now U.S. Pat. No. 7,439,530, issued on Oct. 21, 2008, and entitled, LPP EUV LIGHT SOURCE DRIVE LASER SYSTEM, U.S. patent application Ser. No. 11/406,216 filed on Apr. 17, 2006, now U.S. Pat. No. 7,465,946, issued on Dec. 16, 2008, entitled ALTERNATIVE FUELS FOR EUV LIGHT SOURCE, U.S. patent application Ser. No. 11/580,414 filed on Oct. 13, 2006, now U.S. Pat. No. 7,491,954, issued on Feb. 17, 2009, entitled, DRIVE LASER DELIVERY SYSTEMS FOR EUV LIGHT SOURCE, U.S. patent application Ser. No. 11/644,153 filed on Dec. 22, 2006, and published on Jun. 26, 2008, as US2008/0149862-A1, entitled, LASER PRODUCED PLASMA EUV LIGHT SOURCE, U.S. patent application Ser. No. 11/505,177 filed on Aug. 16, 2006, now U.S. Pat. No. 7,843,632, issued on Nov. 30, 2010, entitled EUV OPTICS, U.S. patent application Ser. No. 11/452,558 filed on Jun. 14, 2006, now U.S. Pat. 7,518,787, issued on Apr. 14, 2009, entitled DRIVE LASER FOR EUV LIGHT SOURCE, U.S. Pat. No. 6,928,093, issued to Webb, et al. on Aug. 9, 2005, entitled LONG DELAY AND HIGH TIS PULSE STRETCHER, U.S. application Ser. No. 11/394,512, filed on Mar. 31, 2006, and titled CONFOCAL PULSE STRETCHER, U.S. patent application Ser. No. 11/138,001, filed on May 26, 2005, and published on Nov. 24, 2005, as US2005/0259709-A1, and titled SYSTEMS AND METHODS FOR IMPLEMENTING AN INTERACTION BETWEEN A LASER SHAPED AS A LINE BEAM AND A FILM DEPOSITED ON A SUBSTRATE; and U.S. patent application Ser. No. 10/141,216, filed on May 7, 2002, now U.S. Pat. No. 6,693,939, and titled, LASER LITHOGRAPHY LIGHT SOURCE WITH BEAM DELIVERY, U.S. Pat. No. 6,625,191 issued to Knowles et al on Sep. 23, 2003, entitled VERY NARROW BAND, TWO CHAMBER, HIGH REP RATE GAS DISCHARGE LASER SYSTEM, U.S. patent application Ser. No. 10/012,002, U.S. Pat. No. 6,549,551 issued to Ness et al on Apr. 15, 2003, entitled INJECTION SEEDED LASER WITH PRECISE TIMING CONTROL, U.S. patent application Ser. No. 09/848,043; U.S. Pat. No. 6,567,450 issued to Myers et al on May 20, 2003 entitled VERY NARROW BAND, TWO CHAMBER, HIGH REP RATE GAS DISCHARGE LASER SYSTEM, U.S. patent application Ser. No. 09/943,343, U.S. patent application Ser. No. 11/509,925 filed on Aug. 25, 2006, now U.S. Pat. No. 7,476,886, issued on Jan. 13, 2009, entitled SOURCE MATERIAL COLLECTION UNIT FOR A LASER PRODUCED PLASMA EUV LIGHT SOURCE, the entire contents of each of which are hereby incorporated by reference herein.

FIELD

The present application relates to extreme ultraviolet ("EUV") light sources providing EUV light from a plasma created from a source material and collected and directed to a focus for utilization outside of the EUV light source chamber, e.g., for semiconductor integrated circuit manufacturing photolithography e.g., at wavelengths of around 50 nm and below.

BACKGROUND

EUV light, e.g., electromagnetic radiation in the EUV spectrum (i.e. having wavelengths of about 5-100 nm) may be useful in photolithography processes to produce extremely small features, e.g. sub-32 nm features, in semiconductor substrates such as silicon wafers.

Methods to produce EUV light include, but are not necessarily limited to, converting a material into a plasma state that has one or more elements, e.g., xenon, lithium or tin, indium, antimony, tellurium, aluminum, etc., with one or more emission line(s) in the EUV spectrum. In one such method, often termed laser produced plasma ("LPP"), a plasma can be produced by irradiating a target material, such as a droplet, stream or cluster of material having the line-emitting element, with a laser beam. Another method involves disposing the line-emitting element between two electrodes. In this method, often termed discharge produced plasma ("DPP"), a plasma can be produced by creating an electrical discharge between the electrodes.

Heretofore, various systems in which a line-emitting element is presented for irradiation/electric discharge have been disclosed. Many diverse forms and states have been attempted, to include, presenting the element in pure form, e.g., pure metal, presenting the element as a compound, e.g., a salt, or as an alloy, e.g. with some other metal, or in a solution, e.g., dissolved in a solvent such as water. Moreover, systems have been disclosed in which the line-emitting substance is presented as a liquid, including relatively volatile liquids, a gas, a vapor and/or a solid, and can be in the form of a droplet, stream, moving tape, aerosol, particles in a liquid stream, particles in a droplet stream, gas jet, etc.

For these processes, the plasma is typically produced in a sealed vessel, e.g., vacuum chamber, and monitored using various types of metrology equipment. A typical EUV light source may also include one or more EUV mirrors e.g., a substrate covered with a graded, multi-layer coating such as Mo/Si. One or more of these mirrors are then disposed in the sealed vessel, distanced from the irradiation site, and oriented to direct EUV light emitted from the plasma to an EUV light source output. In general, these EUV mirrors may be either near-normal incidence type mirrors or grazing incidence type mirrors. By way of example, for an LPP setup, the mirror may be in the form of an ellipsoidal, e.g. a prolate spheroid having a circular cross section normal to a line passing through its loci near-normal incidence type, with an aperture to allow the laser light to pass through and reach the irradiation site. With this arrangement, the irradiation site may be positioned at or near a first focus of the ellipsoid and the light source output may be positioned at, near or downstream of the second ellipsoid focus.

In addition to generating EUV radiation, these plasma processes described above may also generate undesirable by-products in the plasma chamber which can include out-of-band radiation, high energy ions and debris, e.g., atoms and/or clumps/micro-droplets of the target material. These plasma formation by-products can potentially heat, damage or reduce the operational efficiency of the various plasma chamber optical elements including, but not limited to, collector mirrors including multi-layer mirror coatings (MLM's) capable of EUV reflection at near-normal incidence and/or grazing incidence, the surfaces of metrology detectors, windows used to image the plasma formation events, and the laser input window. The heat, high energy ions and/or debris may be damaging to the optical elements in a number of ways, including coating them with materials which reduce light transmission, penetrating into them and, e.g., damaging structural integrity and/or optical properties, e.g., the ability of a mirror to reflect light at such short wavelengths, corroding, roughening or eroding them and/or diffusing into them.

Accessing contaminated or damaged optical elements in the plasma chamber for the purpose of cleaning or replacing the elements can be expensive, labor intensive and time-consuming. In particular, these systems typically require a rather complicated and time consuming purging and vacuum pump-down of the plasma chamber prior to a re-start after the plasma chamber has been opened. This lengthy process can adversely affect production schedules and decrease the overall efficiency of light sources for which it is typically desirable to operate with little or no downtime.

For some target materials, e.g., tin, it may be desirable to introduce an etchant, e.g., HBr or some other halogen-containing compound, or H radicals, into the plasma chamber to etch material, e.g. debris that has deposited on the optical elements. This etchant may be present during light source operation, during periods of non-operation, or both. It is further contemplated that the affected surfaces of one or more elements may be heated to initiate reaction and/or increase the chemical reaction rate of the etchant and/or to maintain the etching rate at a certain level. For other target materials, e.g., lithium, it may be desirable to heat the affected surfaces where lithium debris has deposited to a temperature sufficient vaporize at least a portion of the deposited material, e.g. a temperature in the range of about 400 to 550 degrees C. to vaporize Li from the shield surface, with or without the use of an etchant.

One way to reduce the influence of debris is to move the collector mirror further away from the irradiation site. This, in turn, implies the use of a larger collector mirror to collect the same amount of light. The performance of a collector mirror, e.g., the ability to accurately direct as much in-band light as possible to, e.g., a focal point, depends of the figure and surface finish, e.g., roughness of the collector. As one might expect, it becomes more and more difficult/expensive to produce a suitable figure and surface finish as the size of the collector mirror grows. For this environment, EUV mirror substrate considerations may include one or more of the following: vacuum compatibility, mechanical strength, e.g. high temperature strength, high thermal conductivity, low thermal expansion, dimensional stability, and ease of producing a suitable figure and finish.

Many factors may affect the in-band output intensity (and angular intensity distribution) from an EUV light source and these factors may change over the lifetime of the light source. For example, in an LPP system, changes in collector reflectivity, target size, laser pulse energy and duration and/or coupling of laser pulse and target material, e.g., as a function of steering and focusing may affect in-band EUV output intensity. Thus, it may be desirable to determine which component/sub-systems are adversely affecting in-band EUV output intensity so that the problem can be remedied. If possible, it may be desirable to diagnose the performance of each component/sub-system while they are in position in the light source (i.e. in-situ) and/or while the EUV light source is operating.

With the above in mind, applicants disclose EUV light source components and methods for producing, using and refurbishing EUV light source components.

SUMMARY

In a first aspect of an embodiment of the present patent application, a method for in-situ monitoring of an EUV mirror to determine a degree of optical degradation may comprise the step/act of irradiating at least a portion of the mirror with light having a wavelength outside the EUV spectrum while the EUV mirror is in an operational position in a photolithography apparatus. The method may further comprise the steps/acts of measuring at least a portion of the light after the light has reflected from the mirror and using the measurement and a pre-determined relationship between mirror degradation and light reflectivity to estimate a degree of multi-layer mirror degradation.

In one implementation of this method, the mirror may be operationaly positioned in an EUV light source portion of the photolithography apparatus and in a particular implementation, the mirror may be a near-normal incidence multi-layer mirror. In one embodiment, the irradiating act may be performed with a point source of visible light, for example, the point source may be a light emitting diode or a light source in combination with an aperture, e.g. a relatively small aperture to define a small region of light emission.

For this method, the mirror may have an ellipsoidal shape defining a first focus and a second focus, and the irradiating step/act may be performed with a point source of visible light positioned at the first focus and the measuring step/act may be performed with a detector positioned at a location closer to the second focus than the first focus.

For example, the irradiating step/act may be performed with a point source positioned at the first focus generating a cone of reflected light having an apex at the second focus, and diffuse reflected light. For this arrangement, the measuring step/act may be performed with a detector positioned at a distance from the second focus to detect diffuse reflected light. In one aspect of a particular implementation, the irradiating step I act may be performed with a laser beam and the measuring step/act may be performed with a detector positioned to detect diffuse reflected light.

In another aspect of an embodiment of the present patent application, a system for in-situ monitoring of an EUV mirror to determine a degree of optical degradation may comprise a light source irradiating at least a portion of the mirror with light having a wavelength in the visible spectrum while the EUV mirror is in an operational position in a photolithography apparatus, and a detector measuring an intensity of at least a portion of the light after the light has reflected from the mirror, the detector generating an output signal for use in estimating a degree of multi-layer mirror degradation.

In still another aspect of an embodiment of the present patent application, a metrology device for measuring a characteristic of EUV radiation may comprise a detecting element and a filter comprising silicon nitride. In one arrangement, the detecting element may be a fluorescent converter and the measured characteristic may be angular intensity distribution. In another arrangement, the detecting element may be a photodiode and the measured characteristic may be intensity.

In one arrangement of this aspect, the filter may further comprise Ru, e.g. a layer of Ru, and in a particular arrangement of this aspect, the filter may further comprise Ru and Zr. In another arrangement of this aspect, the filter may further comprise a plurality of Ru layers and a plurality of silicon nitride layers. In yet another arrangement of this aspect, the filter may further comprise Pd, e.g., a layer of Pd, and in a particular arrangement of this aspect, the filter may further comprise Pd and Zr, In another arrangement of this aspect, the filter may further comprise a plurality of Pd layers and a plurality of silicon nitride layers.

In still another aspect of an embodiment of the present patent application, a metrology device for measuring an angular intensity distribution of EUV light may comprise a fluorescent converter and a filter comprising uranium, In one implementation of this aspect, the filter may further comprise Ru.

In another aspect of an embodiment of the present patent application, a metrology device, e.g. fluorescent converter or photodiode, for measuring a characteristic of EUV radiation may comprise a detecting element and a filter comprising a transmissive multilayer coating having a plurality of bi-layers, each bi-layer having a relatively low refractive index material and a relatively high refractive index material. For example, the coating may be transmissive multilayer coating comprising a plurality of Mo layers and a plurality of Si layers or a transmissive multilayer coating comprising a plurality of Zr layers and a plurality of Si layers.

In another aspect of an embodiment of the present patent application, a metrology device, e.g. fluorescent converter or photodiode, for measuring a characteristic of EUV radiation may comprise a detecting element and a filter comprising uranium and Ru.

In another aspect, a device for removing debris from an EUV light source collector mirror, the debris generated by plasma formation, the collector mirror having a first side covered with a multi-layer near-normal incidence reflective coating and an opposed side, may comprise: a conductive coating deposited to overlay at least a portion of the opposed side; and a system generating electrical currents in the coating to heat the collector mirror. The conductive coating may be, but is not necessarily limited to a vacuum deposited coating, a flame-sprayed coating, an electroplated coating or a combination thereof, In one embodiment, the coating may be configured to heat a first zone of the collector mirror to a first temperature, $T_1$, to remove debris from the first zone and heat a second zone of the collector mirror to a second temperature, $T_2$, to remove debris from the second zone, with $T_1 \neq T_2$. In a particular embodiment, the first zone may have a different coating coverage by area than the second zone. In another particular embodiment, the first zone may have a different coating thickness than the second zone. In another particular embodiment, the first zone may have a different coating conductivity than the second zone. The above implies that there could be three or more zones at different temperatures, e.g., more than just two zones. In one implementation, the system may be configured to generate electro-magnetic radiation and the system may deliver an electro-magnetic radiation power, $P_1$, to the first zone of the collector mirror, and an electro-magnetic radiation power, $P_2$, to the second zone of the collector mirror, with $P_1 \neq P_2$.

In another aspect of the present patent application, an EUV collector mirror device having a surface exposed to debris generated by plasma formation, may comprise a substrate covered with a multi-layer near-normal incidence reflective coating, the substrate made of a material doped with a conductive material; and a system generating electrical currents in the substrate to heat the collector mirror.

In one embodiment of this aspect, the coating may be configured to heat a first zone of the collector mirror to a first temperature, $T_1$, to remove debris from the first zone and heat a second zone of the collector mirror to a second temperature, $T_2$, to remove debris from the second zone, with $T_1 \neq T_2$. In a particular implementation, the first zone may have a different substrate conductivity than the second zone. In another implementation, the system may be configured to generate electro-magnetic radiation and the system may deliver an electro-magnetic radiation power, $P_1$, to the first zone of the collector mirror, and an electro-magnetic radiation power, $P_2$, to the second zone of the collector mirror, with $P_1 \neq P_2$.

In another aspect of the present patent application, a method for preparing a near-normal incidence, EUV mirror may comprise the steps/acts of providing a substrate; diamond turning a surface of the substrate; depositing at least one intermediate material overlying the surface using physical vapor deposition; and depositing a multi-layer mirror coating overlying the intermediate material.

For example, the multilayer mirror coating may comprise alternating layers of Mo and Si.

For this aspect, the substrate may be selected from the group of metallic materials consisting of invar, covar, monel, hastelloy, nickel, inconel, titanium, nickel-phosphite plated/coated aluminum, nickel-phosphite plated/coated invar, nickel-phosphite plated/coated covar or the substrate may be a semi-conductor material , e.g. single- or multi-crystalline silicon, In some arrangements, the mirror may be an ellipsoidal mirror having a diameter greater than 500 mm.

In one embodiment, the intermediate material may comprises an etch stop material having a substantially different etch sensitivity than the multi-layer mirror coating for at least one etchant, and in particular embodiments, the etch stop material may be selected from the group of materials consisting of Si, $B_4C$, an oxide, SiC and Cr. In some cases, the etch stop layer may have a thickness in the range of 3 nm to 100 nm.

In one embodiment, the intermediate material may comprise a barrier material substantially reducing diffusion of the metallic substrate into the multi-layer mirror coating, and in particular embodiments, the barrier material may be selected from the group of materials consisting of ZrN, Zr, $MoSi_2$, $Si_3N_4$, $B_4C$, SiC and Cr.

In one embodiment, the intermediate material may comprise a smoothing material, and in particular embodiments, the smoothing material may be selected from the group of materials consisting of Si, C, $Si_3N_4$, $B_4C$, SiC, ZrN, Zr and Cr. In some implementations, the smoothing material may be deposited using highly energetic deposition conditions, for example, the deposition conditions include substrate heating and/or the deposition conditions include increasing particle energy during deposition.

In some cases, the smoothing layer may overlay and contact the metallic substrate. In one embodiment, the smoothing layer may have a thickness in the range of 3 nm to 100 nm. In a particular implementation, the smoothing layer may comprise an amorphous material.

In one implementation, the depositing step/act may be performed using a physical vapor deposition technique selected from the group of techniques consisting of ion beam sputter deposition, electron beam physical vapor deposition magnetron sputtering and combinations thereof.

In another aspect of the present patent application, a method for refurbishing a near-normal incidence, EUV mirror may comprise the steps/acts of providing an EUV mirror having a substrate, at least one intermediate material overlying the substrate and a multi-layer mirror coating overlying the intermediate material; removing the multi-layer mirror coating to produce an exposed surface; and thereafter chemically polishing the exposed surface; depositing a smoothing material; and depositing a multi-layer mirror coating overlying the smoothing material.

In one implementation of this aspect, the intermediate layer may have a thickness in the range of 5 μm to 15 μm and the removing step/act may use diamond turning to remove the multi-layer mirror coating.

In particular implementations, the smoothing material may be selected from the group of materials consisting of ZrN, Zr, $MoSi_2$, $Si_3N_4$, $B_4C$, SiC and Cr.

In a particular implementation, the multi-layer mirror coating may overlay and contact the smoothing material.

In a particular implementation a first intermediate layer, the etch stop layer, e.g. a Cr layer or a $TiO_2$ layer, may be covered by a second intermediate layer, a smoothing layer or diffusion barrier layer, e.g., ZrN, Zr, Si, C, $Si_3N_4$, $B_4C$, SiC, or $MoSi_2$ in order to reduce a surface roughening effect that may be caused by the deposition of the etch stop layer.

In one implementation, the removing step/act may use chemical etching to remove the multi-layer mirror coating and in a particular implementation, the intermediate layer may have a thickness in the range of 5 nm to 20 nm and the removing step/act may use chemical etching to remove the multi-layer mirror coating.

In another aspect of the present patent application, a method for producing EUV light may comprising the acts of providing an EUV mirror having a substrate, a first multi-layer coating stack, a stop layer overlying the first multi-layer coating stack and a second multi-layer coating stack overlying the stop layer; using the mirror to reflect EUV light produced by an EUV light emitting plasma, the plasma generating debris which degrades the second multi-layer coating stack; and thereafter; etching the mirror to expose at least a portion of the stop layer; and thereafter; using the mirror to reflect EUV light produced by an EUV light emitting plasma.

In one implementation of this aspect, the stop layer may comprise a material selected from the group of materials consisting of ZrN, Zr, $Si_3N_4$, $SiB_6$, SiC, C, Cr, $B_4C$, $Mo_2C$, $SiO_2$, $ZrB_2$, $YB_6$ and $MoSi_2$, and the etching step may employ an etchant selected from the group of materials consisting of $Cl_2$, HCl, $CF_4$, and mixtures thereof.

In one embodiment of this method, the second multi-layer coating stack may comprise a plurality of bi-layers, each bi-layer having a layer of Mo and a layer of Si, and in a particular embodiment, the second multi-layer coating stack may comprise a plurality of Mo layers, a plurality of Si layers and a plurality of diffusion barrier layers separating Mo layers from Si layers, In one arrangement, the second multi-layer coating stack may comprise more than forty bi-layers.

In some cases, the stop layer may have a thickness selected to maintain the periodicity of the mirror from the second multi-layer coating stack to the first multi-layer coating stack.

In a particular implementation of this aspect, the stop layer may be a first stop layer and the mirror may comprise a second stop layer overlying the second multi-layer coating stack and a third multi-layer coating stack overlying the second stop layer.

DETAILED DESCRIPTION

Figure 1:
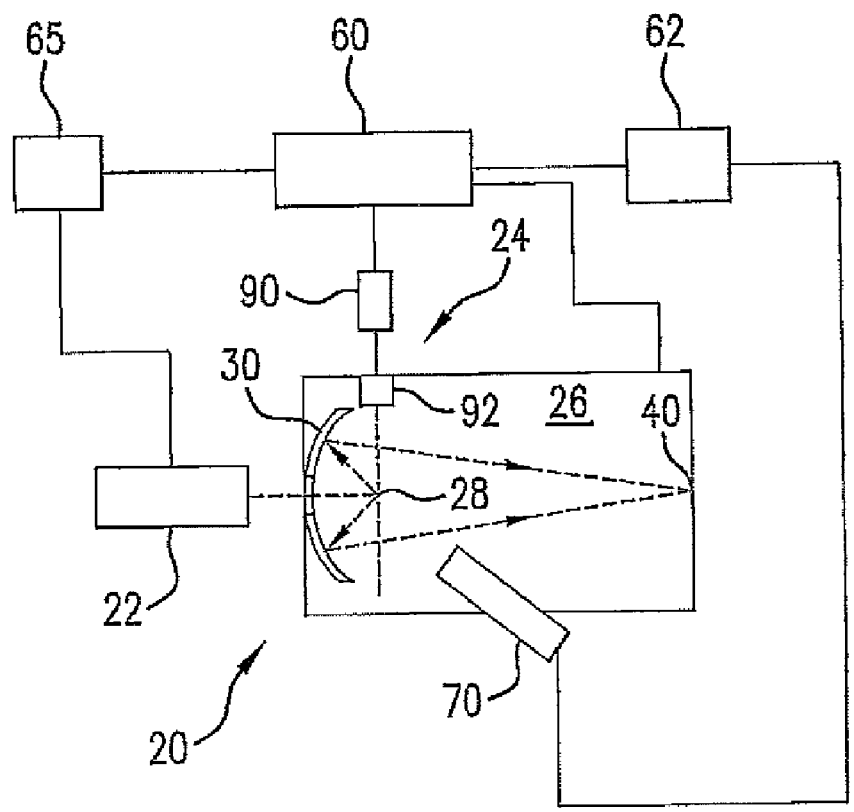
FIG. 1 shows a simplified schematic view of a laser-produced plasma EUV light source according to an aspect of the present disclosure.

With initial reference to FIG. 1 there is shown a schematic view of an EUV light source, e.g., a laser-produced-plasma, EUV light source 20 according to one aspect of an embodiment. As shown in FIG. 1, and described in further details below, the LPP light source 20 may include a system 22 for generating a train of light pulses and delivering the light pulses into a chamber 26. As detailed below, each light pulse may travel along a beam path from the system 22 and into the chamber 26 to illuminate a respective target droplet at an irradiation region, e.g. at or near a focus 28 of an ellipsoidal mirror.

Suitable lasers for use as the device 22 shown in FIG. 1 may include a pulsed laser device, e.g., a pulsed gas discharge $CO_2$ laser device producing radiation at 9.3 µm or 10.6 µm, e.g., with DC or RF excitation, operating at relatively high power, e.g., 10 kW or higher and high pulse repetition rate, e.g., 50 kHz or more. In one particular implementation, the laser may be an axial-flow RF-pumped $CO_2$ having a MOPA configuration with multiple stages of amplification and having a seed pulse that is initiated by a Q-switched Master Oscillator (MO) with low energy and high repetition rate, e.g., capable of 100 kHz operation. From the MO, the laser pulse may then be amplified, shaped, steered and/or focused before entering the LPP chamber. Continuously pumped $CO_2$ amplifiers may be used for the system 22. For example, a suitable $CO_2$ laser device having an oscillator and three amplifiers (O-PA1-PA2-PA3 configuration) is disclosed in U.S. patent application Ser. No. 11/174,299 filed on Jun. 29, 2005, now U.S. Pat. No. 7,439,530, issued on Oct. 21, 2008, and entitled, LPP EUV LIGHT SOURCE DRIVE LASER SYSTEM; the entire contents of which have been previously incorporated by reference herein. Alternatively, the laser may be configured as a so-called "self-targeting" laser system in which the droplet serves as one mirror of the optical cavity, In some "self-targeting" arrangements, a master oscillator may not be required. Self targeting laser systems are disclosed and claimed in U.S. patent application Ser. No. 11/580,414 filed on Oct. 13, 2006, now U.S. Pat. No. 7,491,954, issued on Feb. 17, 2009, entitled, DRIVE LASER DELIVERY SYSTEMS FOR EMT LIGHT SOURCE; the entire contents of which have been previously incorporated by reference herein.

Depending on the application, other types of lasers may also be suitable, e.g., an excimer or molecular fluorine laser operating at high power and high pulse repetition rate. Examples include, a solid state laser, e.g., having a rod, fiber or disk shaped active media, a MOPA configured excimer laser system, e.g., as shown in U.S. Pat. Nos. 6,625,191, 6,549,551, and 6,567,450, an excimer laser having one or more chambers, e.g., an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers, may be suitable. Other designs are possible.

As further shown in FIG. 1, the EUV light source 20 may also include a target material delivery system 24, e.g., delivering droplets of a target material into the interior of a chamber 26 to the irradiation region where the droplets will interact with one or more light pulses, e.g., one or more pre-pulses and thereafter one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region at various temperatures including room temperature or near room temperature (e.g., tin alloys, $SnBr_4$) at an elevated temperature, (e.g., pure tin) or at temperatures below room temperature, (e.g., $Sna_4$), and in some cases, can be relatively volatile, e.g., $SnBr_4$. More details concerning the use of these materials in an LPP EUV source is provided in U.S. patent application Ser. No. 11/406,216 filed on Apr. 17, 2006, now U.S. Pat. No. 7,465,946, issued on Dec. 16, 2008, entitled ALTERNATIVE FUELS FOR EUV LIGHT SOURCE; the contents of which have been previously incorporated by reference herein.

Continuing with FIG. 1, the EUV light source 20 may also include an optic 30, e.g., a collector mirror in the form of a truncated ellipsoid having, e.g., a graded multi-layer coating with alternating layers of molybdenum and silicon. FIG. 1 shows that the optic 30 may be formed with an aperture to allow the light pulses generated by the system 22 to pass through and reach the irradiation region. As shown, the optic 30 may be, e.g., an ellipsoidal mirror that has a first focus within or near the irradiation region and a second focus at a so-called intermediate region 40 where the EUV light may be output from the EUV light source 20 and input to a device utilizing EUV light, e.g., an integrated circuit lithography tool (not shown). It is to be appreciated that other optics may be used in place of the ellipsoidal mirror for collecting and directing light to an intermediate location for subsequent delivery to a device utilizing EUV light, for example the optic may be parabolic or may be configured to deliver a beam having a ring-shaped cross-section to an intermediate location, see e.g. U.S. patent application Ser. No. 11/505,177 filed on Aug. 16, 2006, now U.S Pat. No. 7,843,632, issued on Nov. 30, 2010, entitled EUV OPTICS; the contents of which are hereby incorporated by reference.

Continuing with reference to FIG. 1, the EUV light source 20 may also include an EUV controller 60, which may also include a firing control system 65 for triggering one or more lamps and/or laser devices in the system 22 to thereby generate light pulses for delivery into the chamber 26. The EUV light source 20 may also include a droplet position detection system which may include one or more droplet imagers 70 that provide an output indicative of the position of one or more droplets, e.g., relative to the irradiation region. The imager(s) 70 may provide this output to a droplet position detection feedback system 62, which can, e.g., compute a droplet position and/or trajectory, from which a droplet position error can be computed, e.g., on a droplet by droplet basis or on average. The droplet error may then be provided as an input to the controller 60, which can, for example, provide a position, direction and/or timing correction signal to the system 22 to control a source timing circuit and/or to control a beam position and shaping system, e.g., to change the location and/or focal power of the light pulses being delivered to the irradiation region in the chamber 26.

The EUV light source 20 may include one or more EUV metrology instruments for measuring various properties of the EUV light generated by the source 20. These properties may include, for example, intensity (e.g., total intensity or intensity within a particular spectral band), spectral bandwidth, polarization, beam position, pointing, etc. For the EUV light source 20, the instrument(s) may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the EUV light source 20.

As further shown in FIG. 1, the EUV light source 20 may include a droplet control system 90, operable in response to a signal, which in some implementations may include the droplet error described above, or some quantity derived therefrom the controller 60, to e.g., modify the release point of the target material from a droplet source 92 and/or modify droplet formation timing, to correct for errors in the droplets arriving at the desired irradiation region and/or synchronize the generation of droplets with the pulsed laser system 22.

More details regarding various droplet dispenser configurations and their relative advantages may be found in U.S. patent application Ser. No. 11/827,803 filed on Jul. 13, 2007, now U.S. Pat. No. 7,897,947, issued on Mar. 3, 2011, entitled LASER PRODUCED PLASMA EUV LIGHT SOURCE HAVING A DROPLET STREAM PRODUCED USING A MODULATED DISTURBANCE WAVE, U.S. patent application Ser. No. 11/358,988 filed on Feb. 21, 2006, and published on Nov. 16, 2006, as US2006/0255298-A1, entitled LASER PRODUCED PLASMA EUV LIGHT SOURCE WITH PRE-PULSE; U.S. patent application Ser. No. 11/067,124 filed on Feb. 25, 2005, now U.S. Pat. No. 7,405,416, issued on Jul. 29, 2008, entitled METHOD AND APPARATUS FOR EUV PLASMA SOURCE TARGET DELIVERY, U.S. patent application Ser. No. 11/174,443 filed on Jun. 29, 2005, now U.S. Pat. No. 7,372,056, issued on May 13, 2008, entitled LPP EUV PLASMA SOURCE MATERIAL TARGET DELIVERY SYSTEM, the contents of each of which are hereby incorporated by reference.

Figure 2:
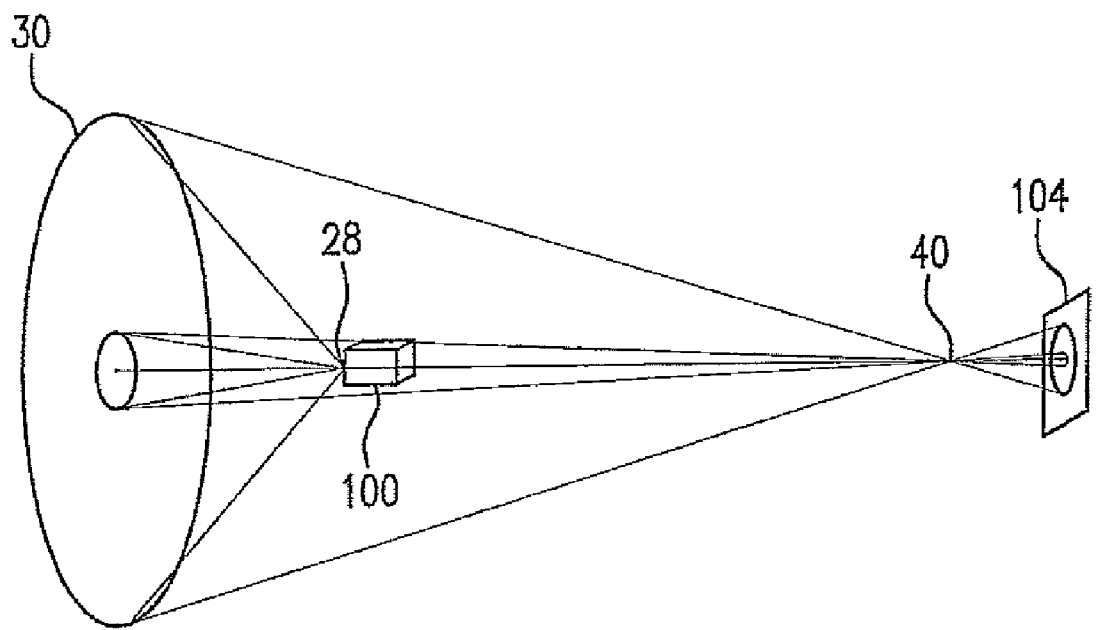
FIG. 2 shows a schematic view of portions of an LPP EUV light source having an apparatus for in-situ monitoring of an ellipsoidal EUV mirror to determine a degree of optical degradation.

Referring now to FIG. 2, an apparatus for in-situ monitoring of an ellipsoidal EUV mirror 30 to determine a degree of optical degradation is shown. As shown, the monitoring apparatus may include a light source 100 positioned to direct light toward the reflective surface of the mirror 30 to illuminate the mirror surface. Typically, the light source provides light which is outside the EUV spectrum (i.e. outside of the wavelength range 1 nm-100 nm. In one setup, the light source may provide visible light. In some cases, it may be favorable to use a point source of light, for example, the point source may be a light emitting diode (LED), e.g., ~1 mm diameter LED with a relatively small emission area and a relatively large divergent light emission may be used. Alternatively, a larger light source positioned behind an aperture for reducing the emission region, e.g., a relatively small aperture, may be used.

For the ellipsoidal shaped mirror, the light source 100 may be positioned at one of the foci, such as the close (or primary) focus 28 shown in FIG. 2, thus, generating a cone of reflected light 102 having an apex at the (far or secondary) focus 40, as shown. Also shown, the monitoring apparatus may include a detector 104 which may include, for example, a screen, e.g. a white screen, for producing an image of the reflected light together with a CCD camera and optional lens for recording the reflected light distribution. Alternatively, a CCD camera may be placed in the light cone after the intermediate focus 40. Although the screen is shown positioned downstream of the secondary focus 40, it may, as an alternative, be positioned between the primary and secondary foci 28, 40. Other suitable detectors may include, but are not necessarily limited to fluorescent screens, photodiode arrays and other optical cameras.

In use, the EUV source 20 shown in FIG. 1 may be operated for a pre-determined number of pulses. The EUV light source 20 may then be shut down and the vacuum chamber 26 opened. Once opened, the light source 100 and detector 104 may be positioned at their respective locations. In an alternate arrangement, a positioning system (not shown), may be installed in the chamber 26 allowing the light source 100 and detector 104 to be positioned without breaking the high vacuum in the chamber 26. In either case, the monitoring apparatus may be used to determine a degree of mirror optical degradation without requiring the mirror to be moved and without affecting the mirror's alignment. Once the light source 100 and detector 104 have been properly positioned, an image of the reflected light may be obtained by the detector and compared to previously obtained data (i.e. a previously measured (i.e. empirically derived) or calculated relationship between mirror degradation and light reflectivity. For example, synchrotron radiation may be used to determine EUV reflectivity to establish an empirical relationship between EUV reflectivity and reflectivity of non-EUV light. Typically, an increase of mirror surface micro-roughness, e.g. caused by ion/particle impacts and/or material deposits, e.g. micro-droplets, etc., will result in a corresponding decrease in specularly reflected light. If desired, the optical degradation measurement may then be used to estimate EUV reflectivity.

Alternatively, or in addition to using the monitoring apparatus after a predetermine number of EUV light output pulses, the monitoring apparatus may be used to diagnose an out-of-spec (or near out-of-spec) EUV light source, for example, an EUV light source having non-spec EUV output intensity, bandwidth, angular uniformity, etc. For a typical EUV light source, a number of factors may affect EUV light output such as mirror reflectivity, input laser energy and characteristics, droplet size, droplet-laser pulse interaction, etc. With this large number of variables, it may be difficult to isolate which factor(s) is causing an out-of-spec EUV output simply by making adjustments to the various light source components. With this in mind, the mirror monitoring apparatus described herein allows an optical degradation measurement to be performed without removing the mirror from the light source and without the need to generate EUV light to perform the measurement.

Figure 3:
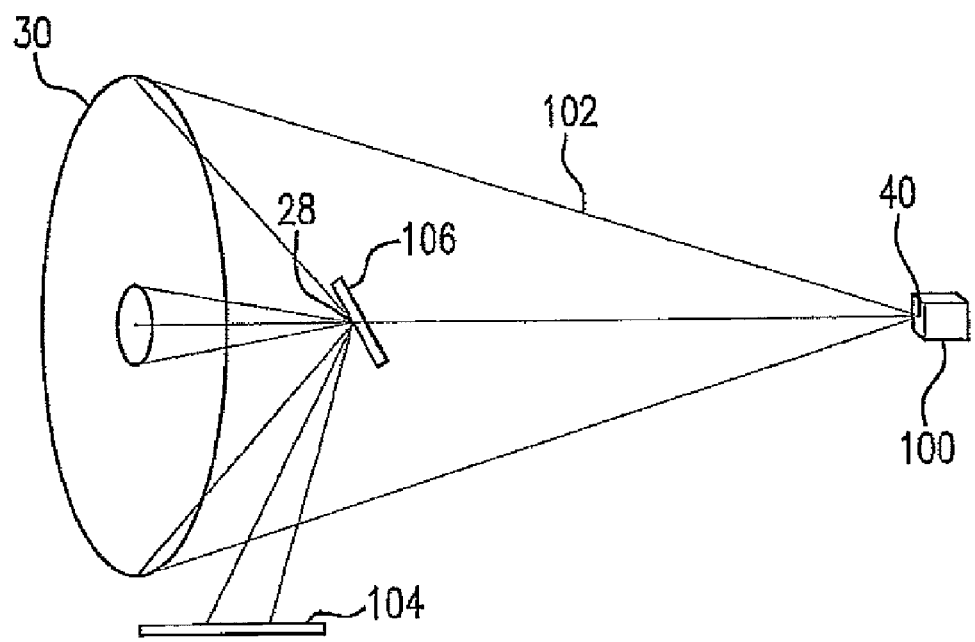
FIG. 3 shows a schematic view of portions of an LPP EUV light source having a different embodiment of an apparatus for in-situ monitoring of an ellipsoidal EUV mirror to determine a degree of optical degradation.

FIG. 3 shows an alternative arrangement in which a light source 100 (e.g., a source emitting light outside the EUV spectrum as described above) may be positioned at one of the foci of an ellipsoidal mirror 30, such as the (far or secondary) focus 40 shown in FIG. 3, and oriented to illuminate the reflective surface of the mirror 30, thus, generating a cone of reflected light 102 having an apex at the close (or primary) focus 28, as shown. Also shown, the monitoring apparatus may include an optic, e.g. a ninety degree turning mirror, positioned at or near the primary focus 28 and oriented to direct light from the primary focus 28 to a detector 104 (as described above). Similarly, the light source may be imaged to the secondary focus 40 by suitable optics and ninety degree turning mirror. Monitoring of optical degradation can thus be made through windows of the source chamber without breaking the vacuum of the system.

Figure 4:
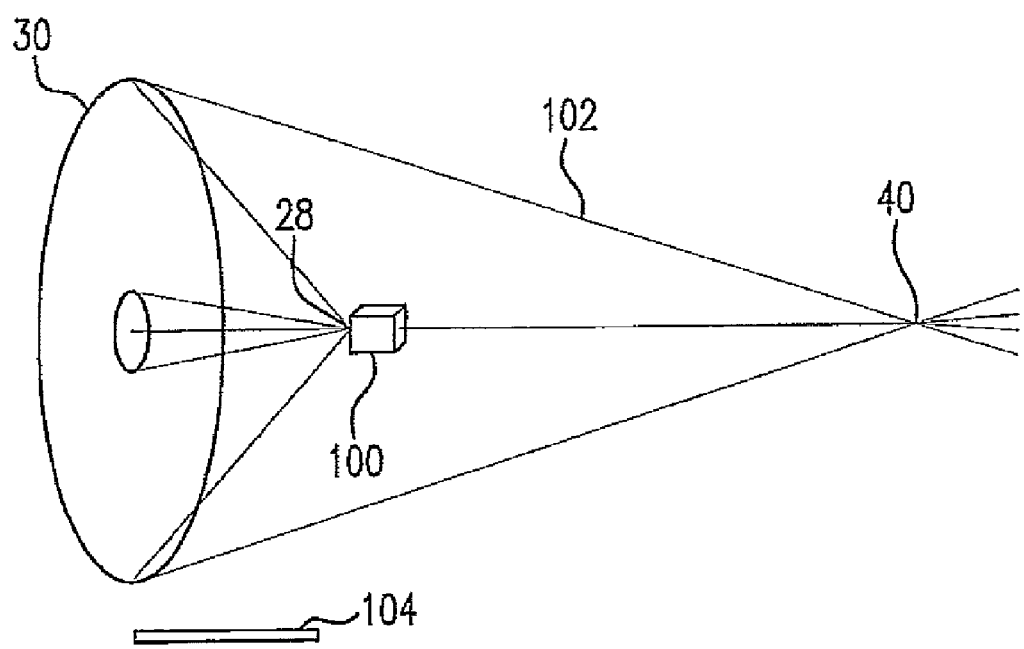
FIG. 4 shows a schematic view of portions of an LPP EUV light source having a different embodiment of an apparatus for in-situ monitoring of an ellipsoidal EUV mirror to determine a degree of optical degradation.

FIG. 4 shows another arrangement in which diffuse reflections, e.g. scattered light, may be evaluated (alone or together with the specular reflections described above) to determine a degree of mirror optical degradation. Typically, an increase of mirror surface microroughness, e.g. caused by ion/particle impacts and/or material deposits, e.g. microdroplets, etc., will result in a corresponding increase in the amount of diffuse reflected light. As shown, a light source 100 may be positioned or projected to illuminate a portion or all of the EUV mirror 30 surface resulting in specular reflections related to the general figure of the mirror surface and diffuse reflections related to small-scale surface roughness, e.g. caused by ion/particle impacts and/or material deposits. For the particular example shown in FIG. 3, the light source 100 is shown positioned at the primary focus 28 of an ellipsoidal mirror 30, thus, generating a cone of specularly reflected light 102 having an apex at the secondary focus 40, as shown. Also shown, the monitoring apparatus may include a detector 104, e.g. CCD camera as described above, positioned at an oblique angle relative to the illuminating rays to measure the amount of a diffuse reflection. The measured data may then be compared to previously obtained data (i.e., a previously measured (i.e., empirically derived) or calculated relationship between mirror degradation and diffuse light reflectivity.

Figure 5:
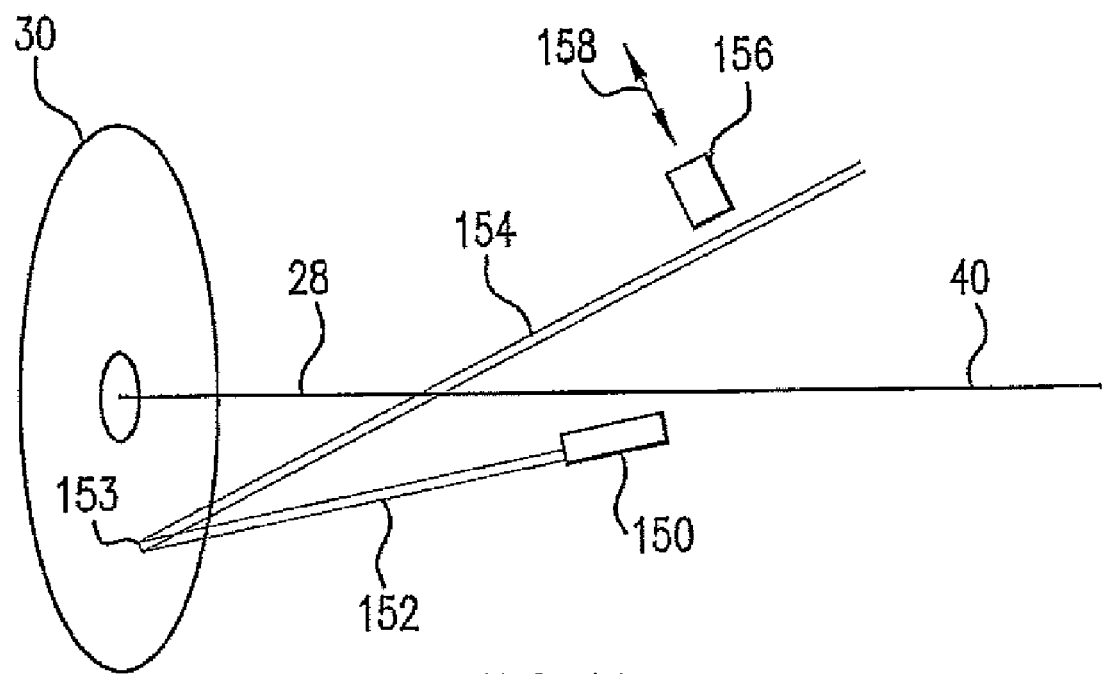
FIG. 5 shows a schematic view of portions of an LPP EUV light source having a different embodiment of an apparatus for in-situ monitoring of an ellipsoidal EUV mirror to determine a degree of optical degradation.

FIG. 5 shows another arrangement in which diffuse reflections, e.g. scattered light, may be evaluated (alone or together with the specular reflections described above) to determine a degree of mirror optical degradation. As shown, a laser source 150 may be positioned to direct an incident laser beam 152 to a relatively small surface location 153 of ellipsoidal EUV mirror 30 surface (having foci 28, 40). As shown, the beam is specularly reflected therefrom as reflected beam 154. Detector 156 is positioned to receive scattered light at a pre-selected angle relative to the angle of incidence, and in some cases, may be moveable, e.g. along arrow 158, to measure scattered light at a plurality of angles, relative to the angle of incidence. Scattered light from several places on the collector mirror 30 surface may be evaluated, or, if desired, the entire surface may be scanned, e.g. raster scan, with the laser beam. The measured data may then be compared to previously obtained data (i.e. a previously measured (i.e. empirically derived) or calculated relationship between mirror degradation and diffuse light reflectivity. The incident and the scattered light can be propagated through chamber windows. Thus, such measurements of scattered light can be made without breaking the vacuum of the system. Although the above description (i.e. description of FIGS. 2-5) has been made with reference to ellipsoidal collector mirrors, it is to be appreciated that the teachings described above extend beyond collector mirrors, and in particular, beyond near-normal incidence ellipsoidal mirrors, to include, but not necessarily limited to, flat mirrors, spherical mirrors, aspherics, parabolic mirrors, grazing angle incidence mirrors and so-called ring field optics/collector mirrors.

Figure 6:
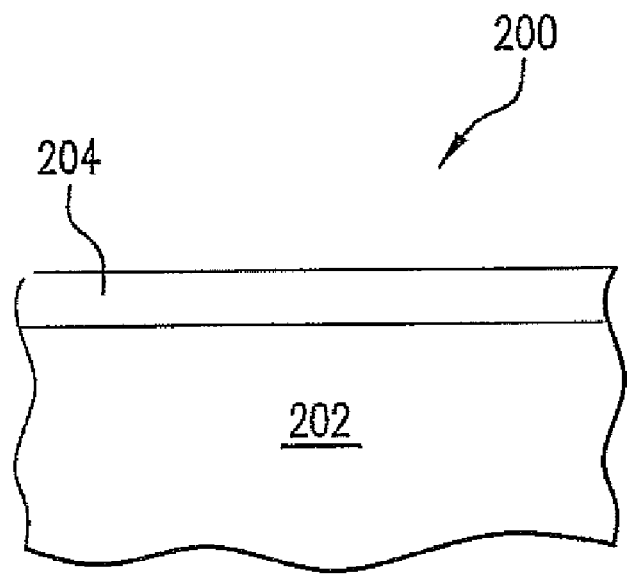
FIG. 6 illustrates a portion of a metrology device for measuring a characteristic of EUV radiation having a detecting element and a narrowband EUV transmission filter.

FIG. 6 illustrates a portion of a metrology device 200 for measuring a characteristic of EUV radiation. As shown, the device 200 may include a detecting element 202 and a narrowband EUV transmission filter 204. For example, the detecting element 202 may be a fluorescence converter, e.g., having a CE:YAG crystal, for measuring, for example, angular intensity distribution of EUV exiting the EUV light source, or the detecting element 202 may be a photodiode for measuring EUV intensity. For the device 200, the filter 204 may be a coating (having one or more layers) deposited to overlay, and in some cases contact, an operable surface of the detecting element 202. Alternatively, or in addition to the deposited coating, the filter 204 may consist of one or more non-deposited films/foils that are positioned along the EUV light path and in front of the detector element 202. In this regard, several filters are disclosed varying in material composition and thickness, with each filter having an EUV transmission bandwidth and peak transmission. Typically, the metrology device 200 may be used downstream of one or more multi-layer mirrors, e.g. Mo/Si mirrors, which reflect light having a relatively small EUV bandwidth and an intensity peak at about 13.5 nm. However, in the absence of suitable filters, metrology detectors measuring the output of an EUV light source may also exposed (undesirably) to light at other wavelengths, e.g. light in the visible, IR and UV spectrums as well as out-of-band EUV radiation. Moreover, as currently contemplated, light exiting an EUV light source may be reflected from a number of Mo/Si mirrors, with each mirror filtering the EUV light source output before the EUV light interacts with a wafer. Thus, it may be desirable to simulate, via filter(s), the EUV light reaching the wafer when performing metrology on the EUV light to source output. Heretofore, it has been suggested to use Zr, which has a relatively wide bandwidth around 13.5 nm, or, Si, which is peaked near 12.5 nm, due to location of Si-absorption edge, or combinations thereof.

Figure 7A:
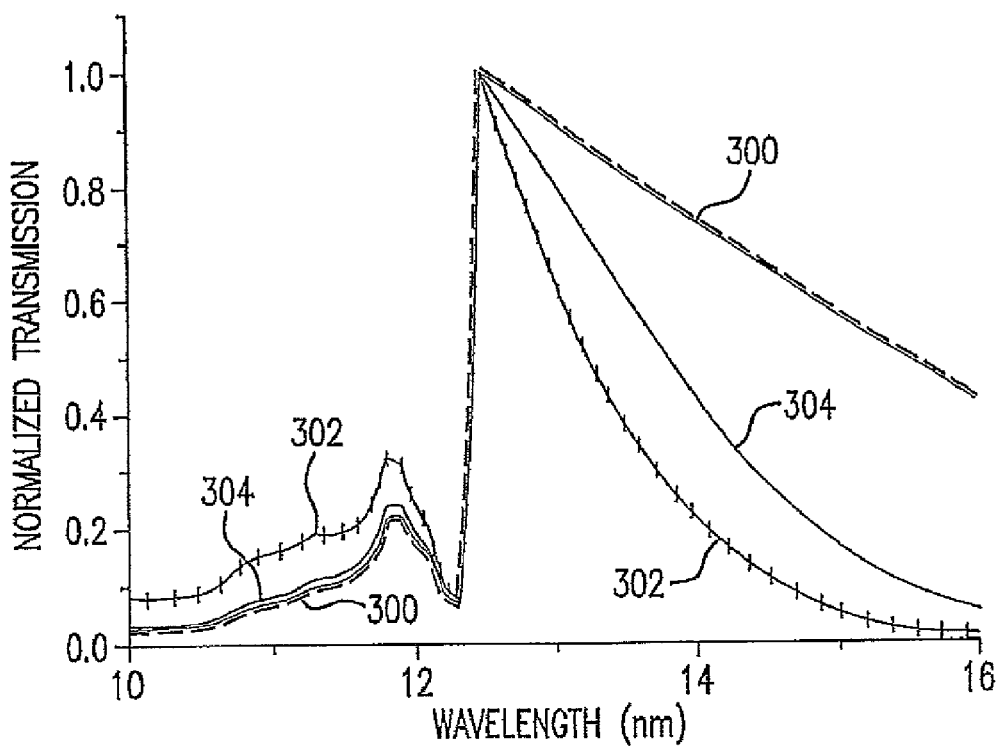
FIG. 7A shows calculated plots of transmission intensity (normalized) versus wavelength in nanometers for various filter materials.

Referring now to FIG. 7A, several calculated plots of transmission intensity (normalized) versus wavelength in nanometers are shown, with plot 300 corresponding to a silicon nitride ($Si_3N_4$) filter having a thickness of 200 nm. As shown, the $Si_3N_4$ filter has a peak transmission at a wavelength of about 12.5 nm. As compared to Si which has been previously suggested for EUV filtration, $Si_3N_4$ foils have higher tensile strength and are also more inert and resistant to chemically aggressive environments. Also, silicon nitride may be combined with a transition metal to produce a bandwidth less than that obtained when only using silicon nitride. FIG. 7A shows calculated plots of transmission intensity (normalized) versus wavelength for two silicon nitride/transition metal combinations. In particular, plot 302 corresponds to a filter having silicon nitride ($Si_3N_4$) having a thickness of 200 nm and Palladium (Pd) at a thickness of 50 nm, and plot 304 corresponds to a filter having silicon nitride ($Si_3N_4$) having a thickness of 200 nm and Ruthenium (Ru) at a thickness of 50 nm. For both plots 302, 304, the transmission peak is near 12.5 nm and the bandwidth is narrower than plot 300 corresponding to a filter having only silicon nitride. Specifically, the full-width half-max (FWHM) bandwidth for $Si_3N_4$/Pd (plot 302) is <1 nm and the FWHM bandwidth for $Si_3N_4$/Ru (plot 304) is near 1.5 nm.

Figure 7B:
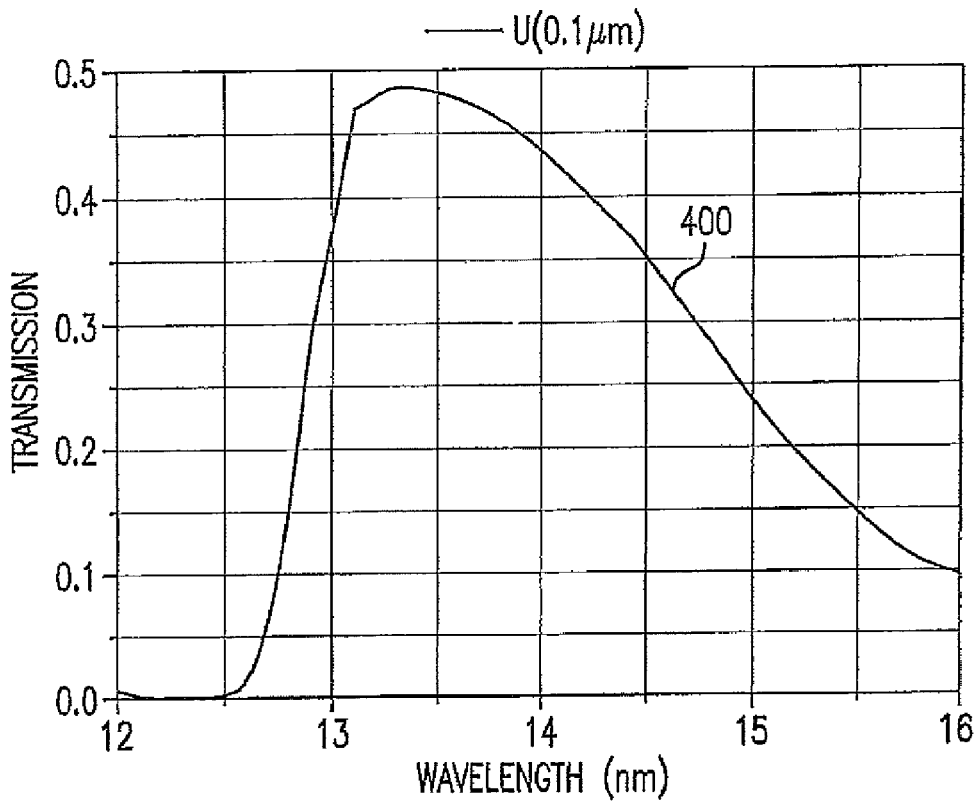
FIGS. 7B, 7C and 7D show calculated plots of transmission intensity versus wavelength in nanometers for de-enriched uranium filters having various thicknesses.
Figure 7C:
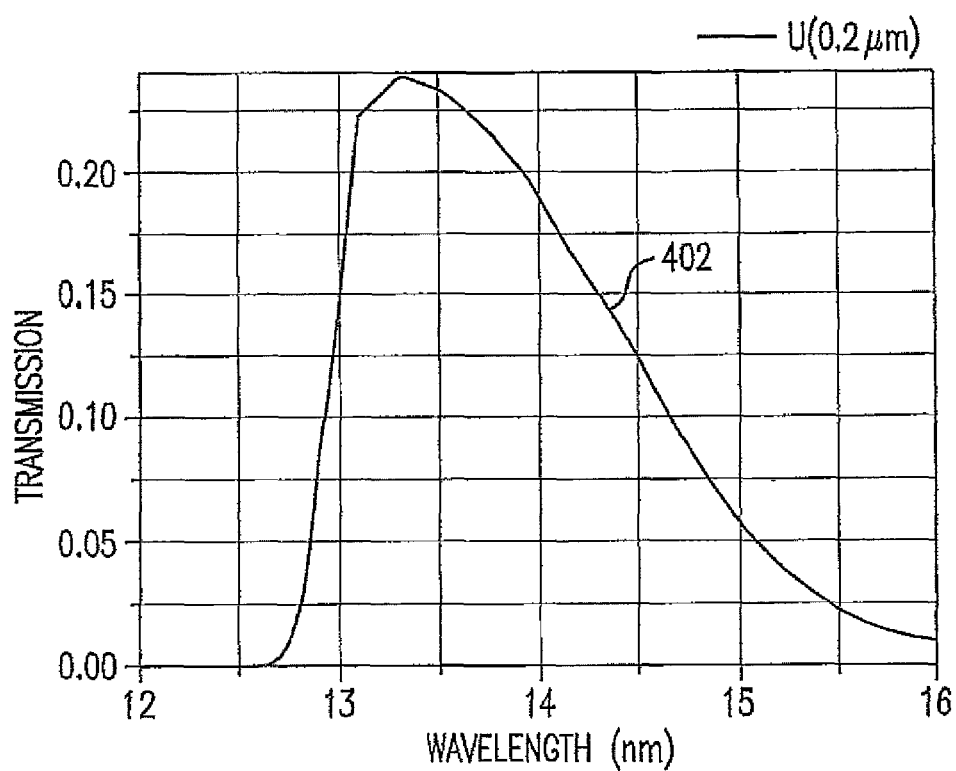
Figure 7D:
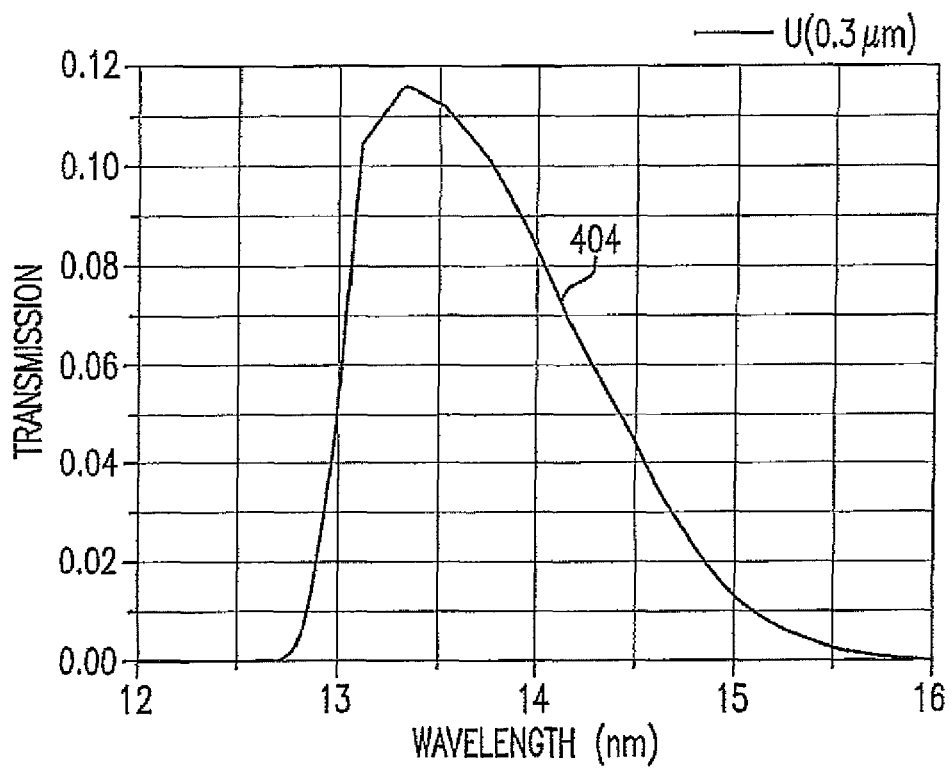

Referring now to FIGS. 7B, 7C and 7D, several calculated plots of transmission intensity versus wavelength in nanometers are shown, with plot 400 (FIG. 7B) corresponding to a de-enriched Uranium filter having a thickness of 0.1 μm, plot 402 (FIG. 7C) corresponding to a de-enriched Uranium filter having a thickness of 0.2 μm plot 404 (FIG. 7D) corresponding to a de-enriched Uranium filter having a thickness of 0.3 μm. As shown, the peak of EUV transmission is near 13.3 nm and the FWHM bandwidth is between about ~2 nm and ~1 nm, depending on the thickness of the filter. Note: the thicker the filter, the narrower the bandwidth and the lower the transmission. It can also be seen that the transmission to EUV radiation near the peak is between 40% and 10%, depending on the thickness of the filter.

Figure 7E:
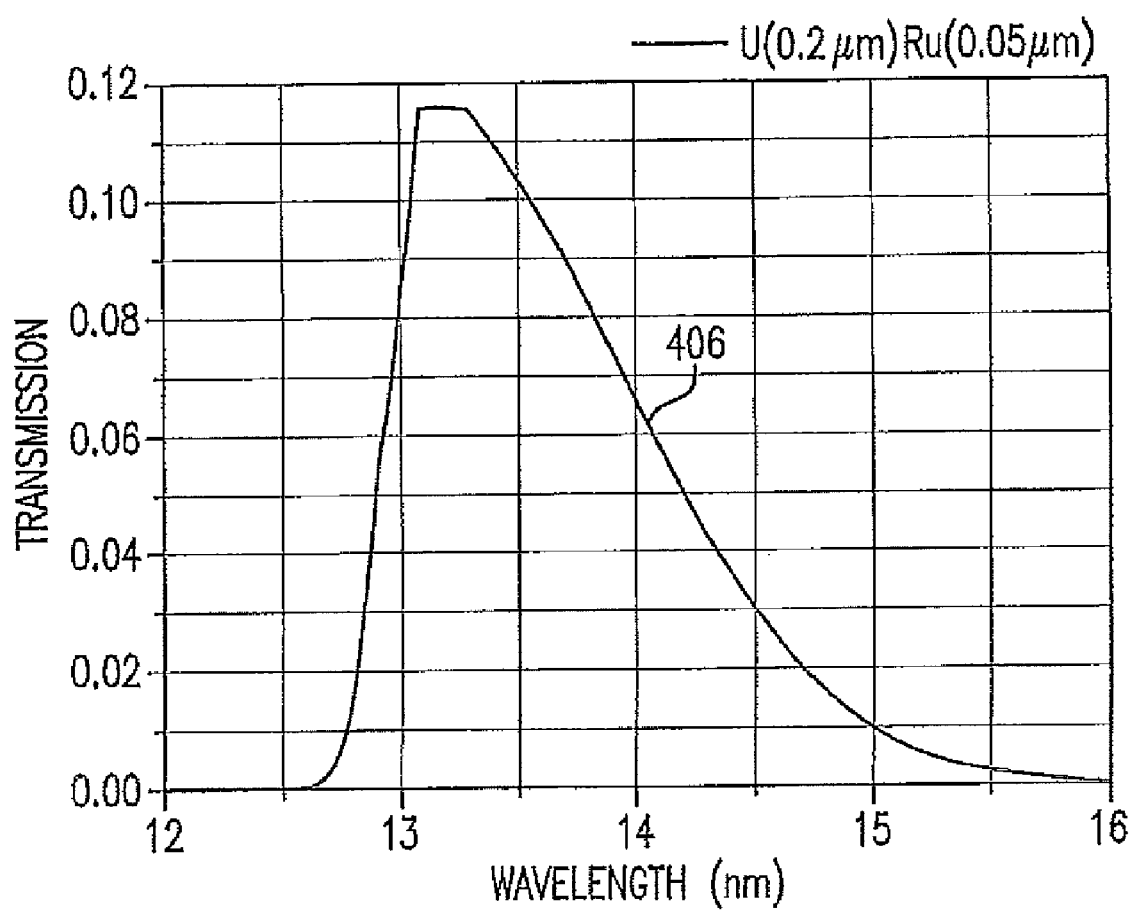
FIG. 7E shows a calculated plot of transmission intensity versus wavelength in nanometers for a filter having about 0.2 μm thick uranium layer and about 50 nm thick Ru layer.

FIG. 7E shows a calculated plot (plot 406) of transmission intensity versus wavelength in nanometers for a filter having about 0.2 μm thick Uranium layer and about 50 nm thick Ru layer. It can be seen that the bandwidth is narrower than Uranium filters (FIGS. 7B-D) and the peak transmission is near 10%. Another suitable filter may be made of a Mo/Si or Zr/Si transmission multilayer consisting of 20 to 40 bilayers. The transmission is near 2% and the bandwidth is about 0.4 nm and the bilayer period is about 7.0 nm in the case of Mo/Si. In the case of a Zr/Si transmission multilayer, using 20 bilayers with e.g. a silicon layer thickness of 4.0 nm and a Zr layer thickness of 1.75 nm, a transmission of almost 80% can be obtained. However, the bandwidth is more than 7 nm wide (full-width at half-maximum) in this case.

Figure 8A:
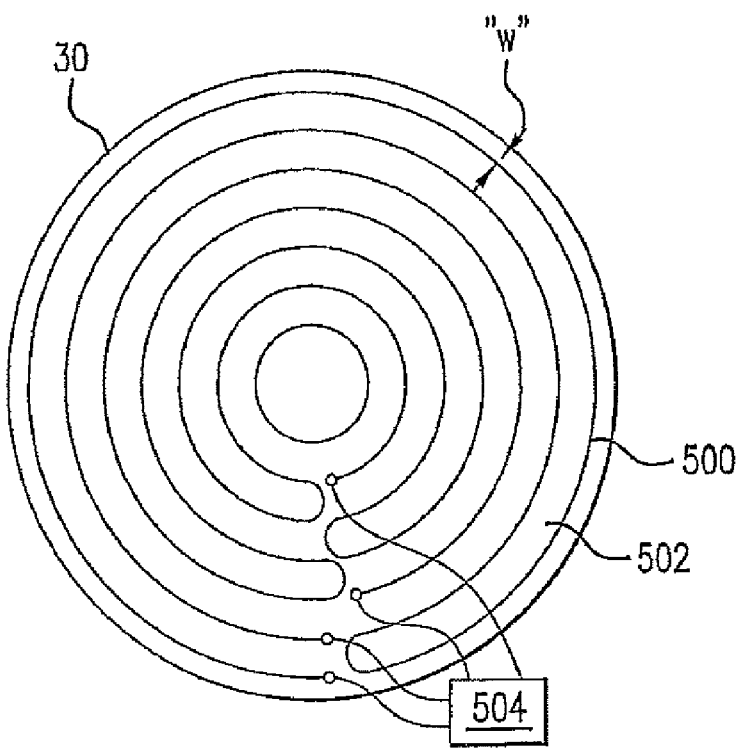
FIGS. 8A, 8B and 8C illustrate three embodiments of backside heaters for an EUV reflective mirror.

FIG. 8A illustrates an embodiment of a backside heater for an EUV reflective mirror, i.e. a heater positioned on the side opposite the reflective surface of the mirror, for controlling the temperature of the reflective surface of a mirror, such as a collector mirror 30. In one application, the heater may be employed to control the mirror's surface temperature, and thus, the etch rate for an BUY light source which employs an etchant to react with plasma generated debris that has deposited on the mirror's surface. Typically, the etch rate may be dependent on temperature. For example, the rate of removal of Tin deposited using HBr and/or $Br_2$ etchants has been found to be strongly dependent on temperature in the range of 150-400° C. As detailed further below, the backside heater may be configured to heat different zones of the surface to different temperatures to maintain a uniform temperature on the mirror's reflective surface, or, to provide higher surface temperatures at zone(s) where more debris is deposited, thus increasing the etch rate for these zone(s). For example, for an ellipsoidal collector mirror with plasma generation at the near focus, some zones of the mirror will be closer to the plasma, and thus, may be heated more due to the plasma than other zones. For this case, if desired, the backside heater may employ differential heating to establish a uniform temperature at the mirror's reflective surface.

Collector mirror lifetime may play a dominant role in the overall cost of an EUV light source. Thus, it may be desirable to employ collector mirror components such as heating systems having relatively long service lives. In this regard, in some arrangements, portions or all of the heating system may be exposed to etchants such as $HBr/Br_2$ as well as elevated temperatures. Moreover, for some arrangements, heating system components may be in fluid communication with the operable portion of the EMT light source. For these arrangements, it may be desirable to use materials which do not create contaminants which may deposit on the operable surfaces of optics and/or absorb EUV light. Coating of mirror fixtures and mirror surfaces that are not used for reflection with a layer of one to several 100 nm thickness of a non-reactive compound like silicon nitride or silicon oxide can be applied to avoid reaction with the etchant and prevent surface erosion.

FIG. 8A shows an arrangement of a backside heater in which a conductive coating 500 such as molybdenum has been deposited onto the backside 502 of the collector substrate in a pre-selected pattern consisting of two circuits, with each circuit having a pair of terminals. Although two circuits are shown in FIG. 8A, it is to be appreciated that more than two and as few as one circuit may be used.

For example, the coating may be applied directly onto the substrate using physical vapor deposition, chemical vapor deposition, flame-spraying electroplating or a combination thereof. Direct application of the substrate provides a good heat contact of the conductive material and the substrate. The substrate may be composed of, for example, SiC, polycrystalline silicon or single crystal silicon. In most cases, it may be desirable to match the thermal expansion coefficient of the conductive coating material and substrate, for example, to prevent cracking, peeling, etc., of the coating. In this regard, Mo and SiC have relatively close thermal expansion coefficients.

The SiC substrate has a fairly high surface resistivity of ~1 $k\Omega/cm$-1000 $k\Omega/cm$, depending on surface purity. The resistance along the Mo backside heater is less than 1 $\Omega/cm$, thus the heating current will flow almost entirely through the Mo heating loops.

FIG. 8A also shows that the backside heater may include a system 504, e.g. one or more regulatable current source(s), generating controllable electrical currents in the coating 500 to heat the collector mirror. For the deposit backside heater shown in FIG. 8A, the amount of heat generated may be selectively varied from one zone to another on the collector surface in several ways. For example, the coating thickness and/or the coating width, "w" and/or surface coverage (e.g. the percentage of surface within a zone covered by conductor) and/or coating conductivity may be varied to establish differential heating. Alternatively, or in addition to the variations described above, multiple circuits may be employed, each having a different patterns and/or each being connected to an independent current source.

Figure 8B:
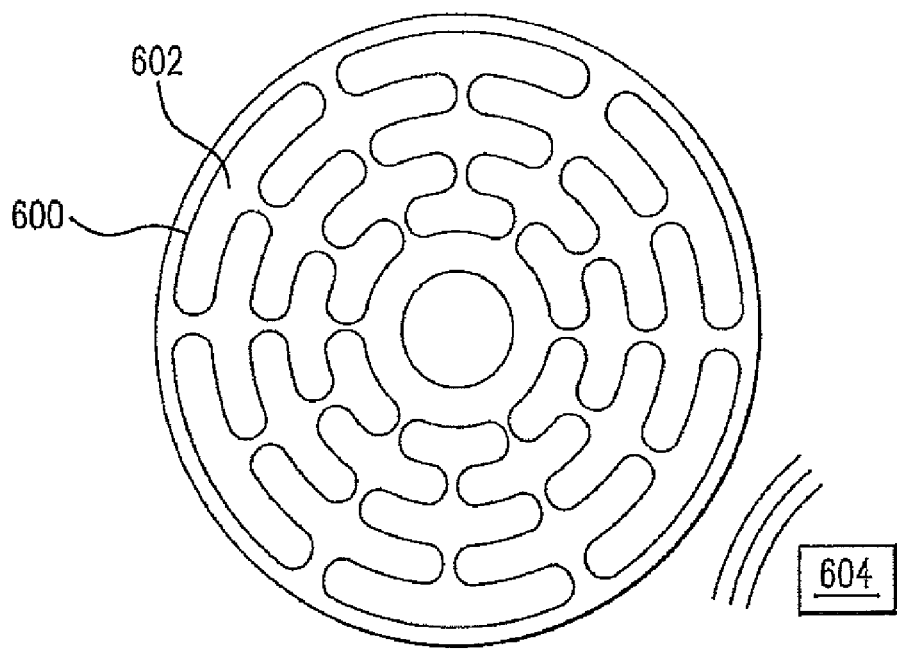

FIG. 8B shows an arrangement of a backside heater in which a conductive coating 600 such as molybdenum has been deposited (e.g. as described above) onto the backside 602 of the collector substrate in a pre-selected pattern consisting of six loops, with each loop forming a closed electrical pathway. Although six loops are shown in FIG. 8B, it is to be appreciated that more than six and as few as one loop may be used. For the backside heater shown in FIG. 8B, a system 604 may be provided selectively establishing eddy currents in each loop to heat the collector mirror surface. For example, the system 604 may consist of one or more inductors positioned behind the collector mirror. In another setup, microwave radiators may be used. If desired, the system 604 may be configured to establish eddy currents in each loop independently, thereby allowing different zones to be heated independently.

For the deposited backside heater shown in FIG. 8B, the amount of heat generated may be selectively varied from one zone to another on the collector surface in several ways. For example, the coating thickness and/or the coating width, "w" and/or surface coverage (e.g. the percentage of surface within a zone covered by conductor) and I or coating conductivity may be varied to establish differential heating. Alternatively, or in addition to the variations described above, multiple loops may be employed, each having a different patterns and/or each being energized by an independent inductor.

Figure 8C:
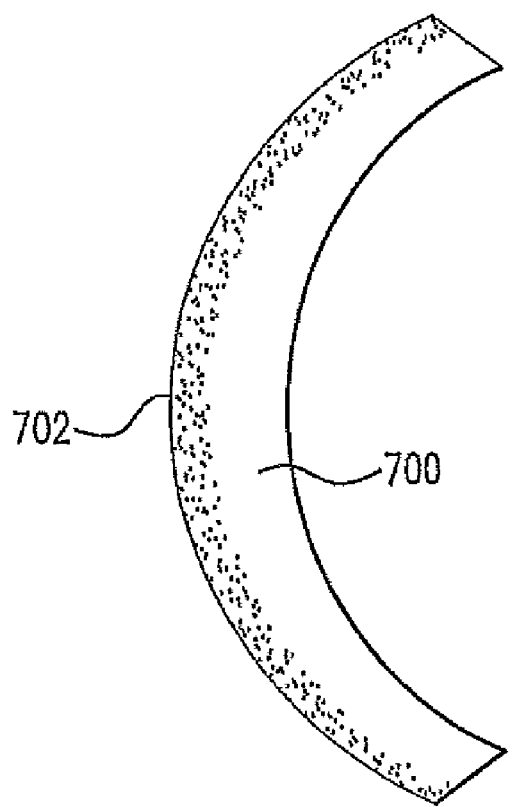

FIG. 8C shows another embodiment in which a portion or all of the mirror substrate 700 may be doped with a conductive material 702, for example, a SiC substrate doped with graphite. With this structural arrangement, the substrate may be selectively heated by exposing the doped portions to RF or microwave radiation. The amount of heat generated may be selectively varied from one zone to another on the collector surface by varying the doping levels within the substrate and/or varying the strength of the radiation reaching a particular zone.

Figure 9A:
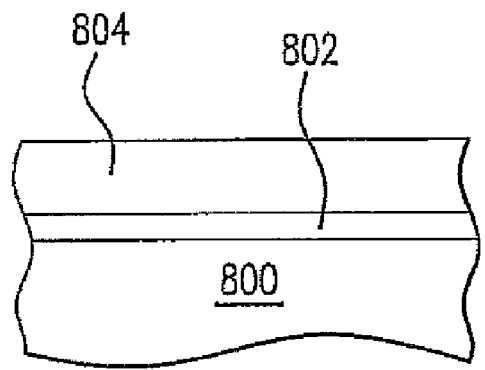
FIG. 9A shows a sectional view of a near-normal incidence EUV collector mirror having a substrate, intermediate layer, and multi-layer minor coating.

FIG. 9A shows a sectional view of a mirror, e.g., a near-normal incidence EUV collector mirror, having a substrate 800, intermediate layer 802, and multi-layer mirror coating 804. FIG. 9A illustrates a method for manufacturing and/or refurbishing an EUV mirror in which a metallic substrate, e.g. Ni, Al, Ti or materials like invar, covar, monel, hastelloy, nickel, inconel, titanium, nickel-phosphite plated/coated aluminum or nickel-phosphite plated/coated invar, or a semi-conductor material like silicon, e.g., single- or multi-crystal-line silicon is diamond turned to produce an exposed surface having the general figure of the final optic, e.g., ellipsoidal, spherical, parabolic, etc., and having a surface roughness of about 2-10 nm. Next, an intermediate layer 802 is deposited which may be a so-called "smoothening" layer deposited using a physical vapor deposition technique to reduce surface roughness which can affect MLM performance. For example, the physical vapor deposition technique may be selected from the group of techniques consisting of ion beam sputter deposition, electron beam deposition, physical vapor deposition, magnetron sputtering and combinations thereof, The smoothing material may be an amorphous material and/or may be selected from the group of materials consisting of Si, C, $Si_3N_4$, $B_4C$, SiC and Cr. The smoothing material may be deposited using highly energetic deposition conditions, for example, the deposition conditions may include substrate heating and/or the deposition conditions may include increasing particle energy during deposition. In some cases, the smoothing layer may overlay and contact the metallic substrate and may have a thickness in the range of about 3 nm to 100 nm. FIG. 9A shows that a multi-layer mirror coating 804, e.g. a coating having about 30-90 Mo/Si bilayers may be deposited to overlay the intermediate layer 802.

Figure 9B:
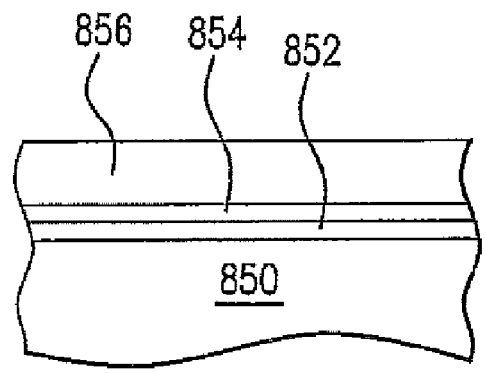
FIG. 9B shows a sectional view of a mirror, e.g., a near-normal incidence EUV collector mirror, having a substrate, first intermediate layer, second intermediate layer and multi-layer mirror coating.

FIG. 9B shows a sectional view of a mirror, e.g., a near-normal incidence EUV collector mirror, having a substrate 850, first intermediate layer 852, second intermediate layer 854 and multi-layer mirror coating 856. FIG. 9A illustrates a method for initial manufacture of an EUV mirror in which a substrate, e.g. made of a material like SiC, polycrystalline silicon, single-crystal silicon, Ni, Al, Ti or materials like invar, covar, monel, hastelloy, nickel, Inconel, titanium, nickel-phosphite plated/coated aluminum is processed by a technique suitable for the shaping the substrate material, e.g., diamond turning, grinding, lapping and polishing, etc., to produce an exposed surface having the general figure of the final optic, e.g., ellipsoidal, spherical, parabolic, etc.

Next, intermediate layers 852, 854 are deposited with one of the layers being so-called "smoothening" layer and the other being a so-called "stop" layer. The "smoothening" layer may be deposited after the "stop" layer, or vice-versa. Each of these layers may be deposited using a physical vapor deposition technique as described above. As described above, the smoothening material may be an amorphous material and/or may be selected from the group of materials consisting of Si, C, $Si_3N_4$, $B_4C$, SiC, ZrN, Zr and Cr, and may be deposited using highly energetic deposition conditions to a thickness in the range of about 3 nm to 100 nm.

Two different types of stop layers are described herein. In one arrangement, a relatively thin "etch" stop layer, (e.g., 1-100 nm and in some cases 5-20 nm) may be used to allow the MLM coating to be removed via etching during a refurbishment procedure, while leaving the etch stop layer. For example, suitable etching techniques may include, but are not necessarily limited to chemical wet etching, dry plasma etching or reactive ion etching. Typically, the etch stop layer material is selected to have a substantially different etch sensitivity than the multi-layer mirror coating for at least one etchant. Suitable etch stop materials may include, but are not necessarily limited to, Si, $B_4C$, oxides such as $TiO_2$, nitrides such as ZrN, SiC, Zr and Cr.

A second type of stop layer is disclosed herein in which a relatively thick stop layer (e.g. 3 μm-20 μm, and in some cases 5 μm to 15 μm) may be used to allow the MLM coating to be removed via diamond turning during a refurbishment procedure, while leaving the etch stop layer. Suitable materials for this second type of stop layer may include, but are not necessarily limited to, Si, $B_4C$, oxides such as $TiO_2$, SiC, Zr, Cr and nitrides such as ZrN.

FIG. 9B also shows that a multi-layer mirror coating 856, e.g. a coating having about 30-90 Mo/Si bilayers may be deposited to overlay the intermediate layers 852, 854.

Refurbishment of the mirror shown in FIG. 9B may be performed by removing the MLM coating 856, either by diamond turning or etching as described above to expose the stop layer and thereafter depositing a smoothening layer on the exposed stop layer followed by depositing a new MLM coating. For the refurbishment, the smoothening layer may be an amorphous material and/or may be selected from the group of materials consisting of Si, C, $Si_3N_4$, $B_4C$, SiC, ZrN, Zr and Cr, and may be deposited using highly energetic deposition conditions to a thickness in the range of about 3 nm to 100 nm.

In addition to the intermediate layers described above, one or more barrier layer to prevent diffusion of one layer into another may be provided, and in some cases a release layer such as chromium or zirconium may be provided overlaying the stop layer to facilitate MLM coating removal. These additional layers may be deposited during initial fabrication and, in some cases during refurbishment. For example, the barrier material may be selected from the group of materials consisting of $MoSi_2$, $Si_3N_4$, $B_4C$, SiC, ZrN, Zr and Cr, and may be positioned somewhere between the substrate and MLM. In some cases, a barrier layer may be provided between the substrate and stop layer and/or between the stop layer and MLM coating.

Figure 10:
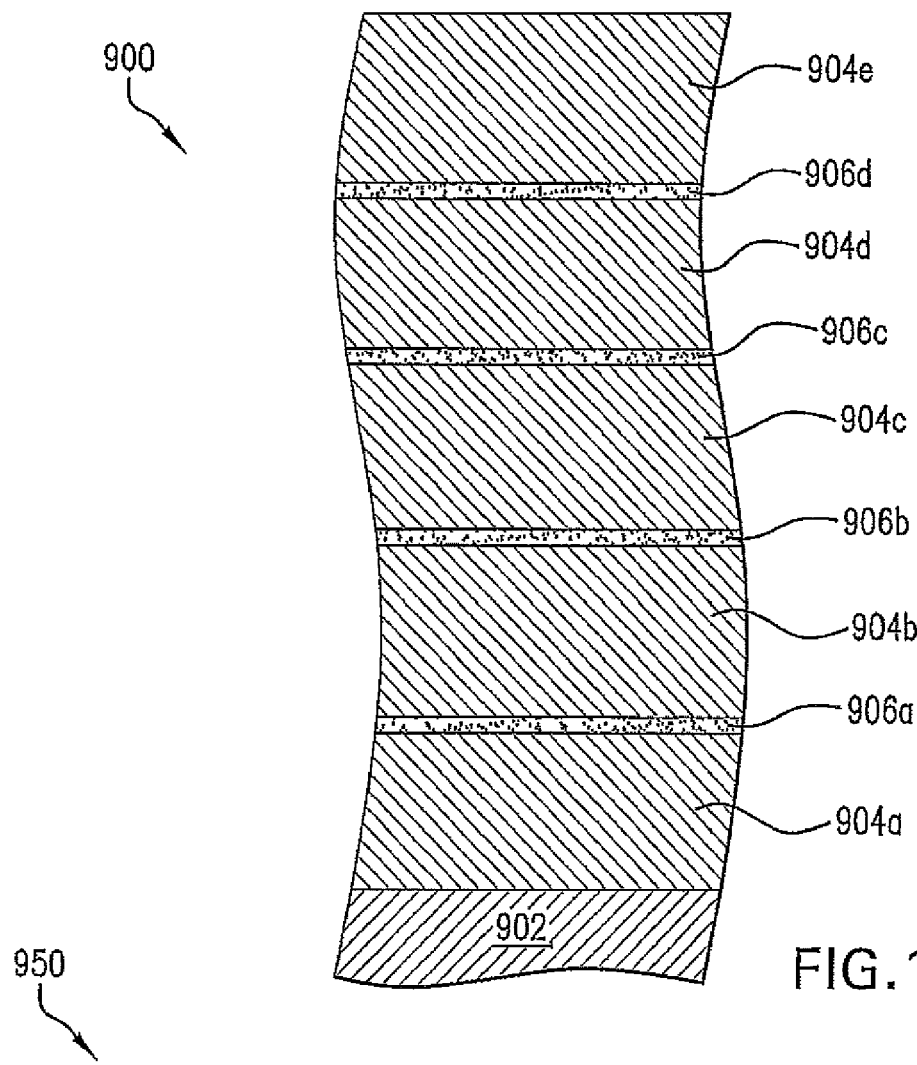
FIG. 10 shows a sectional view of a mirror, e.g., a near-normal incidence EUV collector mirror, having a substrate, five multi-layer coating stacks and four stop layers separating the multi-layer coating stacks.

FIG. 10 shows a sectional view of a mirror, e.g., a near-normal incidence EUV collector mirror 930, having a substrate 902, multi-layer coating stacks 904*a-e* and stop layers 906*a-d*, with each stop layers 906*a-d* interposed between a pair of multi-layer coating stacks 904*a-e*. For example, each multi-layer coating stack 904*a-e* may include about forty to two hundred bi-layers, and more typically eighty to one hundred twenty bi-layers, with each bi-layer having a layer of relatively high refractive index material and a layer of relatively low refractive index material. In one arrangement, each bi-layer may include a layer of Mo and a layer of Si. For the mirror 930, each stop layer 906*a-d* may be formed of a material selected from the group of materials consisting of $Si_3N_4$, $SiB_6$, SiC, C, Cr, $B_4C$, $Mo_2C$, $SiO_2$, $ZrB_2$, $YB_6$ and $MoSi_2$. For the mirror 930, the stop layer may have a thickness selected to maintain the periodicity of the mirror from one adjacent multi-layer coating stack to the other adjacent multi-layer coating stack. For example, the stop layer can be made at a thickness so that it replaces one layer in the multilayer stack that would otherwise be a silicon layer. (e.g., about 4 nm thick for near-normal angle of incidence). In some cases, the stop layer material may be selecting in conjunction with a suitable etchant such that the etchant has a relatively high etch rate for the multi-layer coating stack materials, e.g. Mo and Si, and a relatively high etch rate for the stop layer. Etchants may, for example, be selected from the group of materials consisting of $Cl_2$, HCl, $CF_4$, and mixtures thereof.

Figure 11:
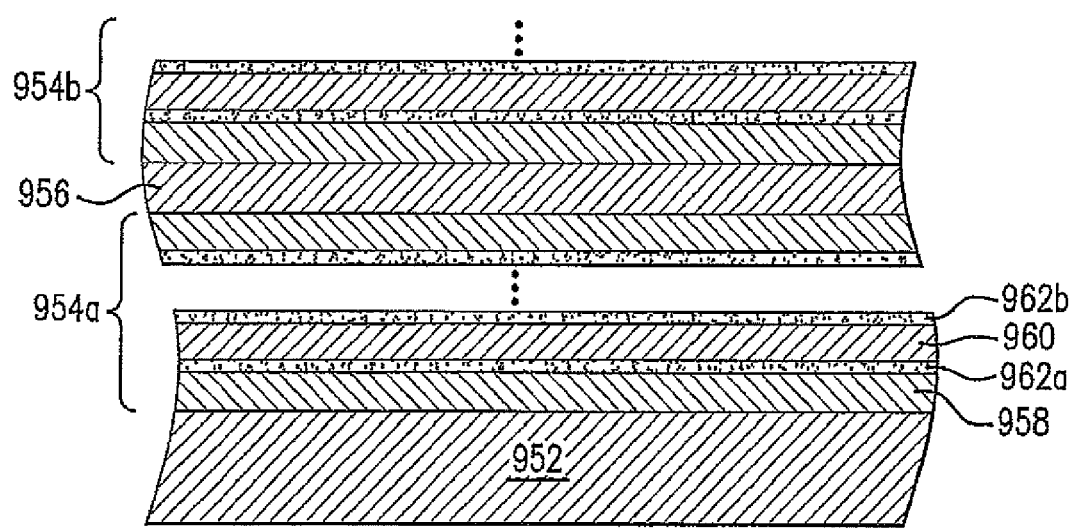
FIG. 11 shows a sectional view illustrating a minor, e.g., a near-normal incidence EUV collector mirror, having a substrate, a plurality of multi-layer coating stacks separated by respective stop layers, each multi-layer coating stack having a plurality of relatively high refractive index layers, a plurality of relatively low refractive index layers and a plurality of diffusion barrier layers separating high index layers from the low index layers.

FIG. 11 shows a sectional view illustrating a mirror 930', e.g., a near-normal incidence EUV collector mirror, having a substrate 952 and multi-layer coating stacks 954*a,b* that are separated by a stop layer 956 (note: the series of dots indicates that the multilayer stack may repeat, as necessary, to establish the desired number of layers). As further shown, each multi-layer coating stack 954*a,b* may have a plurality of relatively high refractive index layers, such as layer 958, a plurality of relatively low refractive index layers, such as layer 960, and a plurality of diffusion barrier layers, such as layers 962*a,b* separating relatively high index layers from the relatively low index layers. In one arrangement, each "bi-layer" may include a layer of Mo, a layer of Si, and two diffusion barrier layers. For example, the diffusion barrier layers may be, for example, silicon nitride, carbon or $B_4C$ and each stop layer 956 may be formed of a material selected from the group of materials consisting of $Si_3N_4$, $SiB_6$, SiC, C, Cr, $B_4C$, $Mo_2C$, $SiO_2$, $ZrB_2$, $YB_6$ and $MoSi_2$.

In use, the mirrors 930, 930' may be disposed in chamber, e.g. chamber 26 shown in FIG. 1, and used to reflect EUV light produced by an EUV light emitting plasma. As described earlier, the plasma may generate debris including energetic ions which may reach and degrade the exposed surface, and, more specifically, the multi-layer coating stack nearest the surface. In most cases, the degradation may not result in uniform wear/removal. Instead, the multi-layer coating stack may be removed unevenly resulting in surface roughness which may decrease the in-band reflectivity of the mirror. In some cases, terraces and mesas may develop.

Once a predetermined amount of coating stack removal and/or a predetermined increase in mirror surface roughness and/or a predetermined decrease in EUV in-band reflectivity has occurred, the remaining portion of the multi-layer coating stack nearest the surface may be etched away, e.g. using an etchant having a relatively high etch rate for the multi-layer coating stack materials, e.g., Mo and Si, and a relatively high etch rate for the stop layer. Once the remaining portion of the multi-layer coating stack nearest the surface is removed, etching may be discontinued until needed again to etch the next multi-layer coating stack, and continued use of the mirror 930, 930' in the light source may occur, with the stop layer acting as a capping layer.

In some cases, etching may be performed in-situ, e.g., with the mirror 930, 930' positioned in the chamber, and in some cases, an etchant may be introduced into the chamber during EUV light production. Alternatively, etching may be performed during periods of scheduled maintenance and/or after removing the mirror 930, 930' positioned in the chamber from the chamber. As indicated above, etchants may, for example, be selected from the group of materials consisting of $Cl_2$, HCl, $CE_4$, and mixtures thereof.

While the particular embodiment(s) described and illustrated in this patent application in the detail required to satisfy 35 U.S.C. §112 are fully capable of attaining one or more of the above-described purposes for, problems to be solved by, or any other reasons for or objects of the embodiment(s) above described, it is to be understood by those skilled in the art that the above-described embodiment(s) are merely exemplary, illustrative and representative of the subject matter which is broadly contemplated by the present application. Reference to an element in the following Claims in the singular is not intended to mean nor shall it mean in interpreting such Claim element "one and only one" unless explicitly so stated, but rather "one or more". All structural and functional equivalents to any of the elements of the above-described embodiment(s) that are known or later come to be known to those of ordinary skill in the art are expressly incorporated herein by to reference and are intended to be encompassed by the present Claims. Any term used in the Specification and/or in the Claims and expressly given a meaning in the Specification and/or Claims in the present Application shall have that meaning, regardless of any dictionary or other commonly used meaning for such a term. It is not intended or necessary for a device or method discussed in the Specification as an embodiment to address or solve each and every problem discussed in this Application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

We claim:

1. An EUV light producing system having at least one mirror disposed in a chamber and a system for monitoring an optical condition of said mirror, comprising:
   a light source irradiating at least a portion of said mirror with first light having a spectrum outside of EUV light spectrum while the mirror is in an operational position characteristic of EUV light production in said chamber; and
   a detector arrangement measuring an optical characteristic of a portion of second light, said second light representing at least a portion of said first light reflected from said portion of said mirror, the detector arrangement generating information pertaining to said optical condition.

2. The EUV light producing system of claim 1 wherein said mirror has a primary focus and a secondary focus, said light source being disposed at said secondary focus, a distance between said secondary focus and said mirror being larger than a distance between said primary focus and said mirror.

3. The EUV light producing system of claim 1 wherein said mirror has a primary focus and a secondary focus, said light source being disposed at said primary focus, a distance between said secondary focus and said mirror being larger than a distance between said primary focus and said mirror.

4. The EUV light producing system of claim 3 wherein said detector arrangement is positioned outside a cone of specularly reflected light from said mirror, said second light representing diffused reflection of said first light after said first light is reflected from said portion of said mirror.

5. The EUV light producing system of claim 1 wherein said first light represents light in the visible light spectrum.

6. The EUV light producing system of claim 1 wherein said mirror has a primary focus and a secondary focus, said light source being disposed at one of said primary focus and said secondary focus, a distance between said secondary focus and said mirror being larger than a distance between said primary focus and said mirror, wherein a distance between said detector arrangement and said mirror is greater than a distance between said primary focus and said mirror.

7. The EUV light producing system of claim 6 wherein said detector arrangement includes at least a screen for receiving said second light.

8. The EUV light producing system of claim 6 wherein said detector arrangement includes at least a charged coupled device (CCD) for receiving said second light.

9. The EUV light producing system of claim 6 wherein said distance between said detector arrangement and said mirror is less than a distance between said secondary focus and said mirror.

10. The EUV light producing system of claim 1 further comprising a positioning system configured to moving said light source into an irradiating position said chamber for said irradiating said at least a portion of said mirror, wherein said light source is not positioned by said positioning system at said irradiating position when said chamber is employed for generating said EUV light.

11. The EUV light producing system of claim 1 wherein said mirror represents a collector mirror.

12. An EUV light producing system having at least a first mirror disposed in a chamber and a system for monitoring an optical condition of said first mirror, comprising:
   a light source irradiating at least a portion of said first mirror with first light having a spectrum outside of EUV light spectrum while said first mirror is in an operational position characteristic of EUV light production in said chamber;
   a detector arrangement; and
   a second mirror for receiving second light and reflecting said second light onto said detector arrangement, said second light representing at least a portion of said first light reflected from said portion of said first mirror, said detector arrangement generating information pertaining to said optical condition.

13. The EUV light producing system of claim 12 wherein said second mirror represents a turning mirror and said first mirror represents a collector mirror.

14. The EUV light producing system of claim 12 wherein said first mirror has a primary focus and a secondary focus, said light source being disposed at said secondary focus, said second mirror being disposed at said primary focus, a distance between said secondary focus and said mirror being larger than a distance between said primary focus and said mirror.

15. The EUV light producing system of claim 12 wherein said detector arrangement is positioned outside a cone of specularly reflected light from said first mirror, said second light representing diffused reflection of said first light after said first light is reflected from said portion of said first mirror.

16. The EUV light producing system of claim 12 wherein said detector arrangement includes at least a charged coupled device (CCD) for receiving said second light from said second mirror.

17. An EUV light producing system, comprising:
   mirror means for reflecting light, said mirror means having a first side and a second side opposite said first side;
   a laser light source disposed toward said first side of said mirror means, wherein a primary focus and a secondary focus are disposed toward said second side of said mirror means, said laser light source configured to irradiate targets at said primary focus through an aperture in said mirror means to generate EUV light which is then reflected by said mirror means to said secondary focus;
   light irradiating means disposed toward said second side of said mirror means for irradiating at least a portion of said mirror means with first light while the mirror means is in an operational position characteristic of EUV light production in said chamber; and
   detecting means for measuring an optical characteristic of a portion of second light, said second light representing at least a portion of said first light reflected from said portion of said mirror means, the detecting means generating information pertaining to an optical condition of said mirror means.

18. The EUV light producing system of claim 17 wherein said light irradiating means is disposed at said secondary focus, a distance between said secondary focus and said mirror being larger than a distance between said primary focus and said mirror.

19. The EUV light producing system of claim 17 wherein said light irradiating means is disposed at said primary focus, a distance between said secondary focus and said mirror being larger than a distance between said primary focus and said mirror.

20. The EUV light producing system of claim 17 wherein said light irradiating means represents another laser light source and said first light is another laser light.

21. The EUV light producing system of claim 20 wherein said second light represents scattered light, said detecting means being movable to measure said second light at a plurality of angles.

22. The EUV light producing system of claim 20 wherein said light irradiating means is configured to scan a surface of said mirror means.

23. The EUV light producing system of claim 20 further comprising a vacuum chamber, wherein said mirror means and said laser light source are disposed within said chamber and wherein at least one of said light irradiating means and said detecting means is disposed outside of said chamber.

\* \* \* \* \*